(12) United States Patent
Ahn et al.

(10) Patent No.: US 12,432,909 B2
(45) Date of Patent: Sep. 30, 2025

(54) SEMICONDUCTOR MEMORY DEVICE HAVING AN OHMIC CONTACT ON THE IMPURITY REGIONS

(71) Applicant: SAMSUNG ELECTRONICS CO., LTD., Suwon-si (KR)

(72) Inventors: Junhyeok Ahn, Suwon-si (KR);
Woojin Jeong, Suwon-si (KR);
Hui-Jung Kim, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 404 days.

(21) Appl. No.: 18/093,561

(22) Filed: Jan. 5, 2023

(65) Prior Publication Data

US 2023/0320080 A1 Oct. 5, 2023

(30) Foreign Application Priority Data

Apr. 5, 2022 (KR) ................. 10-2022-0042425

(51) Int. Cl.
*H10B 12/00* (2023.01)
(52) U.S. Cl.
CPC ......... *H10B 12/485* (2023.02); *H10B 12/482* (2023.02); *H10B 12/488* (2023.02)
(58) Field of Classification Search
CPC .............. H10B 12/0335; H10B 12/053; H10B 12/315; H10B 12/482; H10B 12/485; H10B 12/488; H10B 12/50; H10B 62/83; H10B 64/64
USPC ........................................ 257/906, 907, 908
See application file for complete search history.

(56) References Cited

U.S. PATENT DOCUMENTS

| | | | |
|---|---|---|---|
| 9,337,149 B2 | 5/2016 | Im et al. | |
| 10,361,208 B2 | 7/2019 | Cho | |
| 11,180,373 B2 | 11/2021 | Song et al. | |
| 11,189,622 B1 | 11/2021 | Yang | |
| 2020/0111795 A1* | 4/2020 | Feng | H10B 12/315 |
| 2020/0350256 A1 | 11/2020 | Lee et al. | |
| 2022/0013467 A1 | 1/2022 | Lee et al. | |
| 2022/0045182 A1 | 2/2022 | Kim et al. | |
| 2022/0077154 A1 | 3/2022 | Kim et al. | |

FOREIGN PATENT DOCUMENTS

KR 10-2022-0019175 A 2/2022

OTHER PUBLICATIONS

Brandes, E. A., "Smithells metals reference book" Sixth Edition, osti.gov, Jan. 1, 1983, 2 pages.

* cited by examiner

*Primary Examiner* — Hoai V Pham
(74) *Attorney, Agent, or Firm* — Sughrue Mion, PLLC

(57) ABSTRACT

A semiconductor memory device includes an active portion defined by a device isolation pattern, the active portion including a first impurity region located at a center portion of the active portion and a second impurity region located at an end portion of the active portion, a word line provided on the active portion and extending in a first direction, a bit line provided on the word line and extending in a second direction crossing the first direction, a bit line contact provided between the bit line and the first impurity region of the active portion, a storage node pad provided on the second impurity region of the active portion, and a storage node contact provided on the storage node pad and at a side of the bit line.

20 Claims, 33 Drawing Sheets

SEMICONDUCTOR MEMORY DEVICE HAVING AN OHMIC CONTACT ON THE IMPURITY REGIONS

CROSS-REFERENCE TO RELATED APPLICATIONS

This application is based on and claims priority to Korean Patent Application No. 10-2022-0042425, filed on Apr. 5, 2022, in the Korean Intellectual Property Office, the disclosure of which are incorporated by reference herein in its entirety.

BACKGROUND

1. Field

Example embodiments of the present disclosure relate to a semiconductor memory device and method of manufacturing the same.

2. Description of Related Art

Due to their small-sized, multifunctional capabilities, and/or low-cost characteristics, semiconductor devices are being esteemed as important elements in the electronics industry. With the advancement of the electronic industry, there is an increasing demand for a semiconductor device with higher integration density. To increase the integration density of the semiconductor device, it is necessary to reduce linewidths of patterns constituting the semiconductor device. However, new and expensive exposure technologies are needed to reduce the linewidths of the patterns, and thus, it becomes difficult to increase the integration density of the semiconductor device. Therefore, a variety of new technologies are being recently studied to overcome the difficulty in increasing an integration density of a semiconductor memory device.

In the conventional dynamic random access memory (DRAM) device, in order to achieve a metallic contact (i.e., reduce an electrical resistance) between a storage node contact and an XP Poly, it is necessary to maintain an impurity concentration of the XP Poly to a high value. This causes impurities in the XP Poly to be diffused into an active portion of a substrate to cause a gate induced drain leakage (GIDL) issue.

SUMMARY

Provided is a semiconductor memory device with improved reliability.

Provided is a method of fabricating a semiconductor memory device with improved reliability.

Additional aspects will be set forth in part in the description which follows and, in part, will be apparent from the description, or may be learned by practice of the presented embodiments.

According to an aspect of an example embodiment, a semiconductor memory device may include an active portion defined by a device isolation pattern, the active portion including a first impurity region located at a center portion of the active portion and a second impurity region located at an end portion of the active portion, a word line provided on the active portion and extending in a first direction, a bit line provided on the word line and extending in a second direction crossing the first direction, a bit line contact provided between the bit line and the first impurity region of the active portion, a storage node pad provided on the second impurity region of the active portion, a storage node contact provided on the storage node pad and at a side of the bit line, and an ohmic contact layer provided in at least one of first regions between the first impurity region and the bit line and second regions between the second impurity region and the storage node contact, where the ohmic contact layer may include a two-dimensional material.

According to an aspect of an example embodiment, a semiconductor memory device may include an active portion defined by a device isolation pattern, the active portion including a first impurity region and a second impurity region, a word line provided on the active portion and extending in a first direction, a bit line provided on the word line and extending in a second direction crossing the first direction, a bit line contact provided between the bit line and the first impurity region of the active portion, a storage node pad provided on the second impurity region of the active portion, and a storage node contact provided on the storage node pad and at a side of the bit line. The bit line contact and the storage node pad may include a metallic material, the bit line contact may be vertically spaced apart from the first impurity region of the active portion, and the storage node pad may be vertically spaced apart from the second impurity region of the active portion.

According to an aspect of an example embodiment, a semiconductor memory device may include a device isolation pattern defining active portions including a first impurity region and a second impurity region, a word line extending in a first direction to cross the active portions, a bit line vertically overlapping with the first impurity region, the bit line provided on the word line, and extending in a second direction crossing the first direction, a bit line contact provided between the bit line and the first impurity region, a bit line capping pattern on the bit line contact, a storage node pad on the second impurity region, a first ohmic contact layer on the storage node pad, a storage node contact provided at a side of the bit line and adjacent to the first ohmic contact layer, a landing pad on the storage node contact, a gapfill insulating pattern provided between the storage node pad and the bit line contact, and a bit line spacer provided between the bit line and the storage node contact. The first ohmic contact layer may include at least one of graphene, transition metal dichalcogenides, and black phosphorus.

BRIEF DESCRIPTION OF DRAWINGS

The above and other aspects, features, and advantages of certain example embodiments of the present disclosure will be more apparent from the following description taken in conjunction with the accompanying drawings, in which.

DETAILED DESCRIPTION

Example embodiments of the disclosures will now be described more fully with reference to the accompanying drawings, in which example embodiments are shown.

Figure 1:
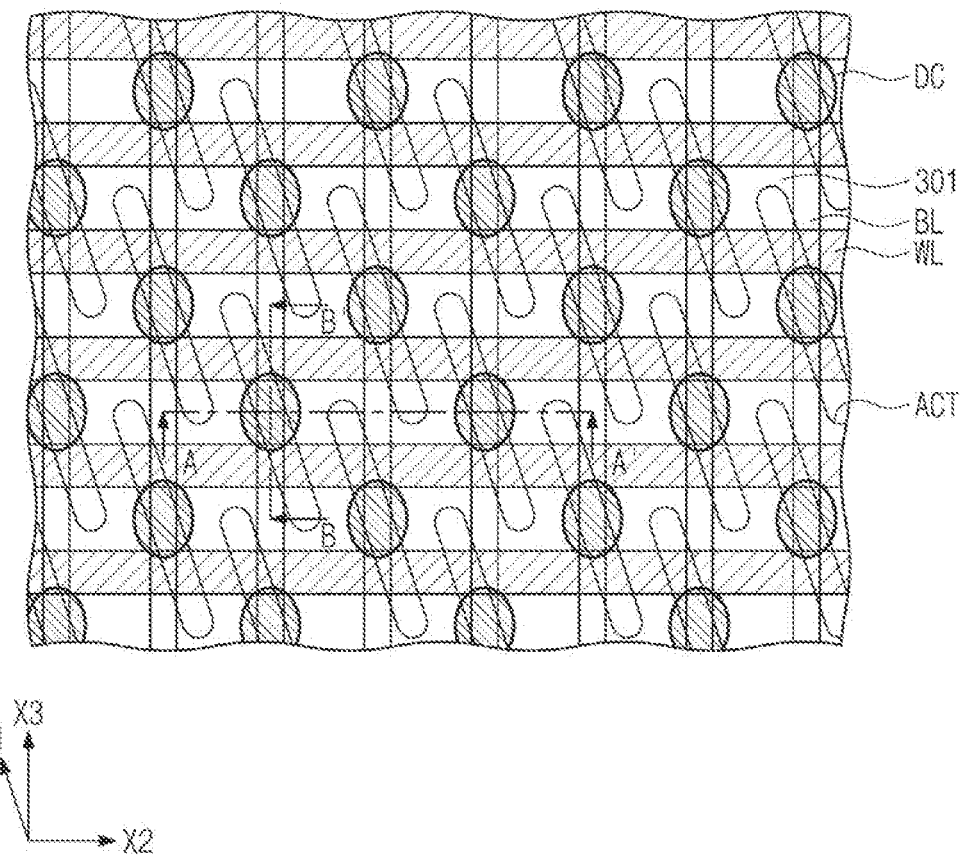
FIG. 1 is a diagram illustrating a semiconductor memory device according to an example embodiment.
Figure 2A:
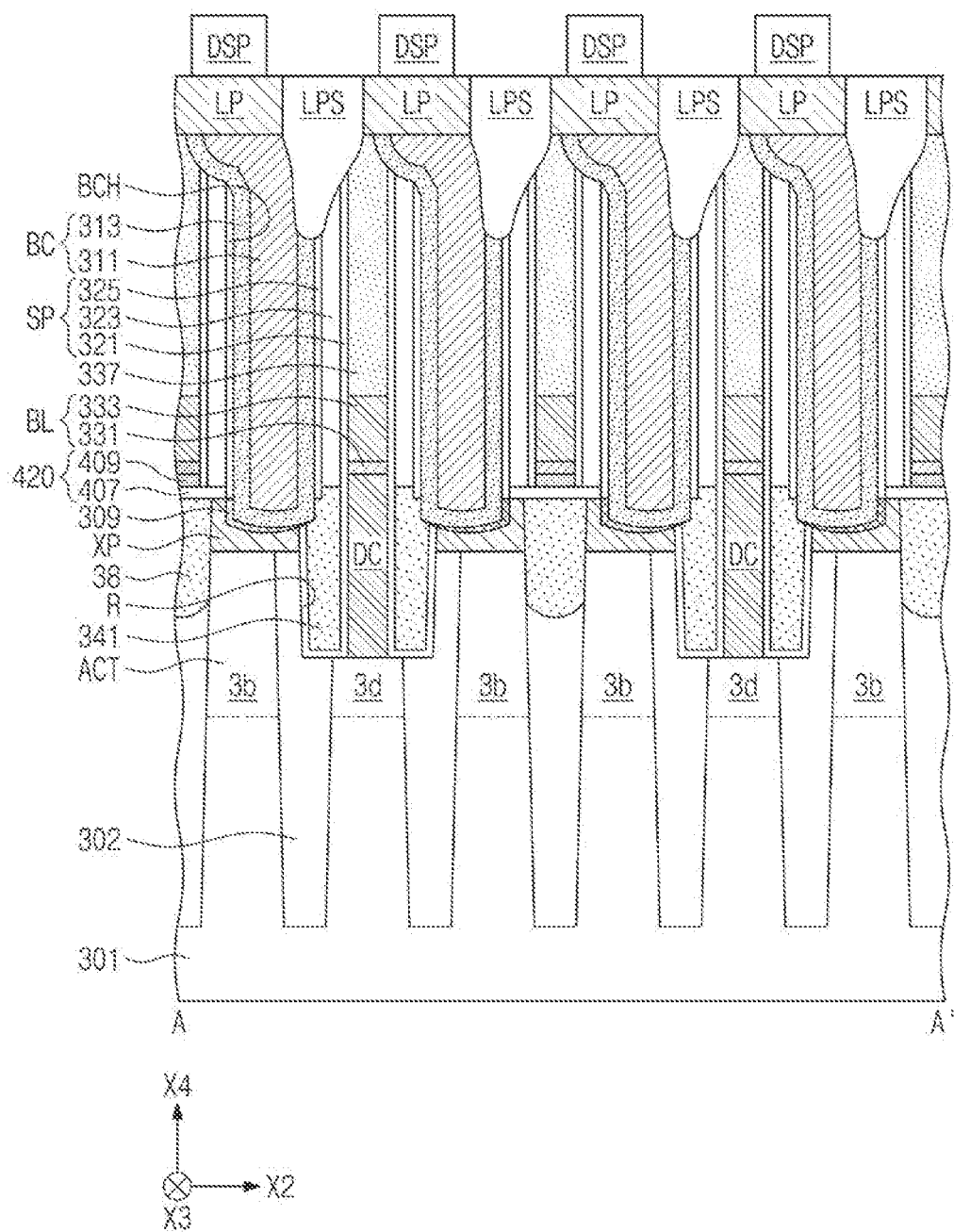
FIG. 2A is a cross-sectional view taken along a line A-A' of FIG. 1 according to an example embodiment.
Figure 2B:
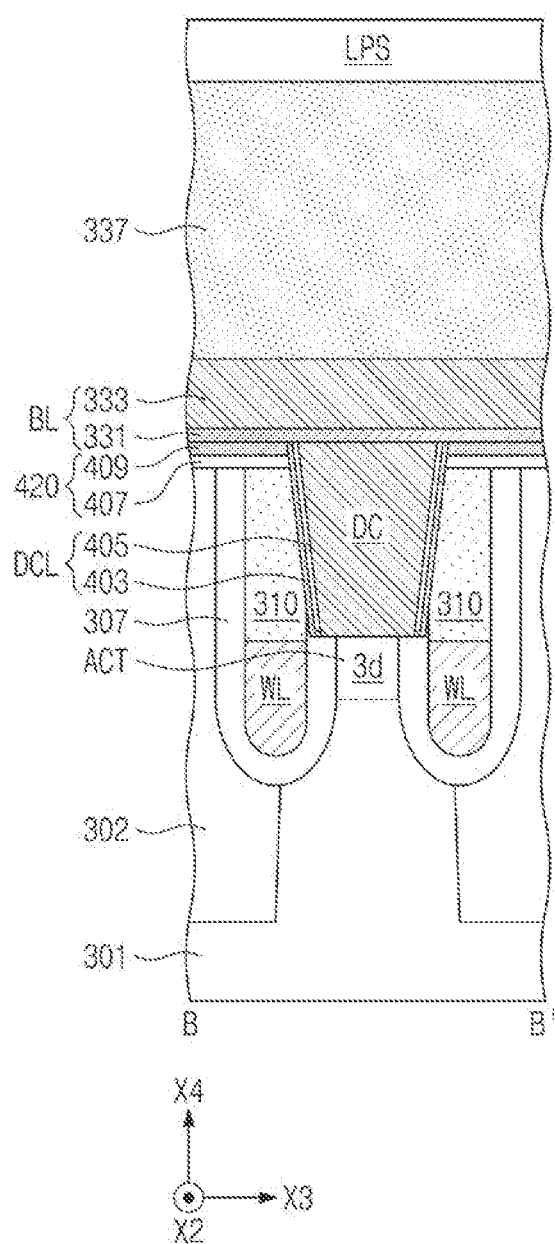
FIG. 2B is a cross-sectional view taken along a line B-B' of FIG. 1 according to an example embodiment.

FIG. 1 is a diagram illustrating a semiconductor memory device according to an example embodiment. FIG. 2A is a cross-sectional view taken along a line A-A' of FIG. 1 according to an example embodiment. FIG. 2B is a cross-sectional view taken along a line B-B' of FIG. 1 according to an example embodiment.

Referring to FIGS. 1, 2A, and 2B, a semiconductor memory device 100 may include a substrate 301. In an embodiment, the semiconductor memory device 100 may be a volatile memory such as dynamic random-access memory (DRAM) device and static RAM (SRAM) or a nonvolatile memory such as phase change RAM (PRAM), magnetic RAM (MRAM), resistance RAM (ReRAM), ferroelectric RAM (FRAM), NOR Flash memory, etc.

The substrate 301 may be formed of or include a semiconductor material. For example, the substrate 301 may be a silicon substrate, a germanium substrate, or a silicon-germanium substrate. Device isolation patterns 302 may be disposed in the substrate 301 to define active portions ACT. Each of the active portions ACT may have an isolated shape. When viewed in a plan view, each of the active portions ACT may be a bar-shaped portion that is extended in a first direction X1. The active portions ACT may correspond to portions of the substrate 301 enclosed by the device isolation patterns 302. The active portions ACT may be arranged to be parallel to each other in the first direction X1, and each active portion ACT may be disposed to have an end portion that is located near a center of another active portion ACT. In an embodiment, the device isolation patterns 302 may be formed of or include at least one of silicon oxide, silicon oxynitride, or silicon nitride and may have a single-layered structure or a multi-layered structure.

Word lines WL may be provided to cross the active portions ACT. The word lines WL may be disposed in grooves, which are formed in the device isolation patterns 302 and the active portions ACT. The word lines WL may be parallel to a second direction X2 crossing the first direction X1. The word lines WL may be formed of or include a conductive material. A gate dielectric layer 307 may be disposed between each of the word lines WL and an inner surface of each of the grooves. The groove may be formed to have a relatively large depth in the device isolation patterns 302 and a relatively small depth in the active portions ACT. The gate dielectric layer 307 may be formed of or include at least one of thermal oxide, silicon oxide, silicon oxynitride, or high-k dielectrics. Each of the word lines WL may have an uneven bottom surface.

A first impurity region $3d$, which is located between each pair of the word lines WL, may be disposed in a portion of each of the active portions ACT, and a pair of second impurity regions $3b$ may be respectively disposed in opposite edge regions of each of the active portions ACT. The first impurity region $3d$ may correspond to a common source region, and the second impurity region $3b$ may correspond to a drain region. Each of the word lines WL, as well as the first impurity region $3d$ and the second impurity region $3b$ adjacent thereto may constitute a transistor. Since the word line WL is disposed in the groove GR, a channel length of a channel region below the word line WL may be increased within a limited planar area.

Top surfaces of the word lines WL may be lower than the top surfaces of the active portions ACT. A word line capping pattern 310 may be disposed on each of the word lines WL. The word line capping patterns 310 may have a line shape extending in a length direction of the word line WL and may cover the entire top surfaces of the word lines WL. The word line capping patterns 310 may fill the grooves on the word lines WL. The word line capping pattern 310 may be formed of or include, for example, silicon nitride. The gate dielectric layer 307 may be extended into regions between the word line capping pattern 310 and the device isolation pattern 302 and between the word line capping pattern 310 and the substrate 301.

Bit lines BL may be disposed on the substrate 301. The bit lines BL may be disposed to cross the word line capping patterns 310 and the word lines WL. As shown in FIG. 2A, the bit lines BL may be parallel to a third direction X3 crossing the first direction X1 and the second direction X2. Hereinafter, a direction perpendicular to the first direction X1, second direction X3, and third direction X3 will be referred to as a fourth direction X4. The bit line BL may include a bit line diffusion prevention pattern 331 and a bit line interconnection pattern 333, which are sequentially stacked. The bit line diffusion prevention pattern 331 may be formed of or include at least one of titanium, titanium nitride, titanium silicon nitride, tantalum, tantalum nitride, or tungsten nitride. The bit line interconnection pattern 333 may be formed of or include at least one of, for example, metallic materials (e.g., tungsten, titanium, aluminum, copper, ruthenium, iridium, or molybdenum). A bit line capping pattern 337 may be disposed on each of the bit lines BL. The bit line capping pattern 337 may be formed of or include an insulating material (e.g., silicon nitride).

A storage node pad XP may be disposed on the active portion ACT with the second impurity region 3b. The storage node pad XP may be formed of or include doped polysilicon.

A pad separation pattern 38 may be interposed between the storage node pads XP. The pad separation pattern 38 may be formed of or include, for example, silicon nitride.

An interlayer insulating pattern 420 may include a first interlayer insulating pattern 407 and a second interlayer insulating pattern 409, which are sequentially stacked. A side surface of the second interlayer insulating pattern 409 may be aligned to the side surface of the bit line BL. A width of the first interlayer insulating pattern 407 in the second direction X2 may be larger than that of the second interlayer insulating pattern 409. A side surface of the first interlayer insulating pattern 407 may be aligned to a side surface of a first spacer 323. The first interlayer insulating pattern 407 and the second interlayer insulating pattern 409 may be formed of or include insulating materials, which have an etch selectivity with respect to each other. For example, the first interlayer insulating pattern 407 and the second interlayer insulating pattern 409 may be formed of or include different materials. In an embodiment, the first interlayer insulating pattern 407 may be formed of or include silicon oxide. The second interlayer insulating pattern 409 may be formed of or include silicon nitride.

Bit line contacts DC may be disposed in a recess region R crossing the bit lines BL. The bit line contacts DC may be formed of or include polysilicon. The bit line contacts DC may be formed of or include doped or undoped polysilicon. The bit line contact DC may electrically connect the first impurity region 3d to the bit line BL. A lower gapfill insulating pattern 341 may be disposed in a portion of the recess region R, in which the bit line contact DC is not disposed. The lower gapfill insulating pattern 341 may be formed of or include silicon nitride or silicon oxynitride.

The side surfaces of the bit line BL and the bit line capping pattern 337 may be covered with a bit line spacer SP. The bit line spacer SP may include a spacer liner 321, a first spacer 323, and a second spacer 325. Each of the spacer liner 321, the first spacer 323, and the second spacer 325 may be independently formed of or include one of silicon oxide, silicon nitride, silicon oxynitride, or silicon oxycarbide.

In an embodiment, the spacer liner 321 and the first spacer 323 may be formed of or include the same material (e.g., silicon oxide). Alternatively, the spacer liner 321 may have a material having an etch selectivity with respect to the first spacer 323, and in this case, the spacer liner 321 may be formed of or include silicon nitride, and the first spacer 323 may be formed of or include silicon oxide.

The second spacer 325 may be formed of or include an insulating material (e.g., silicon nitride) having an etch selectivity with respect to the first spacer 323.

The spacer liner 321 may be extended to conformally cover a portion of bottom surface, side surfaces of the recess region R, a side surface of the bit line contact DC and a side surface of the storage node pad XP. The gapfill insulating pattern 341 may be located on the spacer liner 321 to fill the recess region R. The second spacer 325 may have a bottom end lower than a bottom end of the first spacer 323.

A plurality of node separation patterns may be disposed between adjacent ones of the bit line spacers SP. Between the bit line spacers SP, the node separation patterns may be arranged to form a single column and to be spaced apart from each other. The node separation patterns may be overlapped with the word lines WL. Storage node contact holes BCH may be defined between the bit line spacers SP and between the node separation patterns. The node separation patterns may be formed of or include an insulating material (e.g., silicon oxide).

A storage node contact BC may be interposed between adjacent ones of the bit lines BL. The storage node contact BC may be configured in the storage node contact hole BCH between adjacent ones of the bit lines BL.

The storage node contact BC may include a contact metal pattern 311 and a contact diffusion prevention pattern 313, which is provided to enclose side and bottom surfaces of the contact metal pattern 311. The contact diffusion prevention pattern 313 may be provided to conformally cover side and bottom surfaces of the storage node contact hole BCH. Both of the contact metal pattern 311 and the contact diffusion prevention pattern 313 may be formed of or include at least one of metallic materials. The contact diffusion prevention pattern 313 may be formed of or include at least one of, for example, titanium, titanium nitride, titanium silicon nitride, tantalum, tantalum nitride, or tungsten nitride. The contact metal pattern 311 may be formed of or include at least one of metallic materials (e.g., tungsten, aluminum, and copper). The contact diffusion prevention pattern 313 may have a rounded bottom surface. The contact metal pattern 311 may have a rounded bottom surface.

A first ohmic contact layer 309 may be interposed between the storage node contact BC and the storage node pad XP. For example, the first ohmic contact layer 309 may be formed of or include at least one of two-dimensional materials. The two-dimensional material may refer to a material, in which atoms are arranged to form a single layer. In an embodiment, the two-dimensional material may include at least one of graphene, transition metal dichalcogenides (TMDC), or black phosphorus (BP). The first ohmic contact layer 309 may have a rounded section. Alternatively, the first ohmic contact layer 309 may have a rounded bottom surface. A contact surface (or a top surface) of the storage node pad XP in contact with the first ohmic contact layer 309 may also have a rounded shape.

The first ohmic contact layer 309 may be formed of or include a two-dimensional material (e.g., graphene). In this case, the first ohmic contact layer 309 may have a low Schottky barrier and a low electrical resistance. In the case where the first ohmic contact layer 309 is interposed between the storage node contact BC and the storage node pad XP on the second impurity region 3b, it may be unnecessary to maintain the storage node pad XP at a high impurity concentration, due to the low electrical resistance of the first ohmic contact layer 309. As a result, the semiconductor device disclosed herein may prevent impurities in the storage node pad XP from being diffused into the second impurity region 3b and thereby to improve reliability of the semiconductor memory device 100.

Landing pads LP may be provided on the storage node contacts BC, respectively. When viewed in a plan view, the landing pads LP may be spaced apart from each other and may have an isolated island shape. Six landing pads LP may be provided to form a regular hexagonal shape enclosing one landing pad LP. The landing pads LP may be arranged to form a honeycomb shape.

Data storage patterns DSP may be disposed on the landing pads LP, respectively. The data storage patterns DSP may be a capacitor including a bottom electrode, a dielectric layer, and a top electrode. In this case, the semiconductor memory device 100 may be a DRAM device. Alternatively, the data storage patterns DSP may include a magnetic tunnel junction pattern. In this case, the semiconductor memory device 100 may be an MRAM device. In an embodiment, the data storage patterns DSP may be formed of or include a phase-change material or a variable resistance material. In this case, the semiconductor memory device 100 may be a PRAM device or a ReRAM device.

In the section B-B' shown in FIG. 2B, a contact insulating pattern DCL may be interposed between the bit line contact DC and the word line capping pattern 310, which are disposed below the bit line BL. The contact insulating pattern DCL may include a first contact insulating pattern 403 and a second contact insulating pattern 405. The first contact insulating pattern 403 may be in contact with a side surface of the word line capping pattern 310 and a side surface of the interlayer insulating pattern 420, which are a side surface of a contact hole DCH to be described below. The second contact insulating pattern 405 may be in contact with a side surface of the bit line contact DC. The first contact insulating pattern 403 may cover a bottom surface of the second contact insulating pattern 405. The first contact insulating pattern 403 and the second contact insulating pattern 405 may be formed of or include materials different from each other. For example, the first contact insulating pattern 403 may be formed of or include silicon nitride, and the second contact insulating pattern 405 may be formed of or include silicon oxide.

Figure 2C:
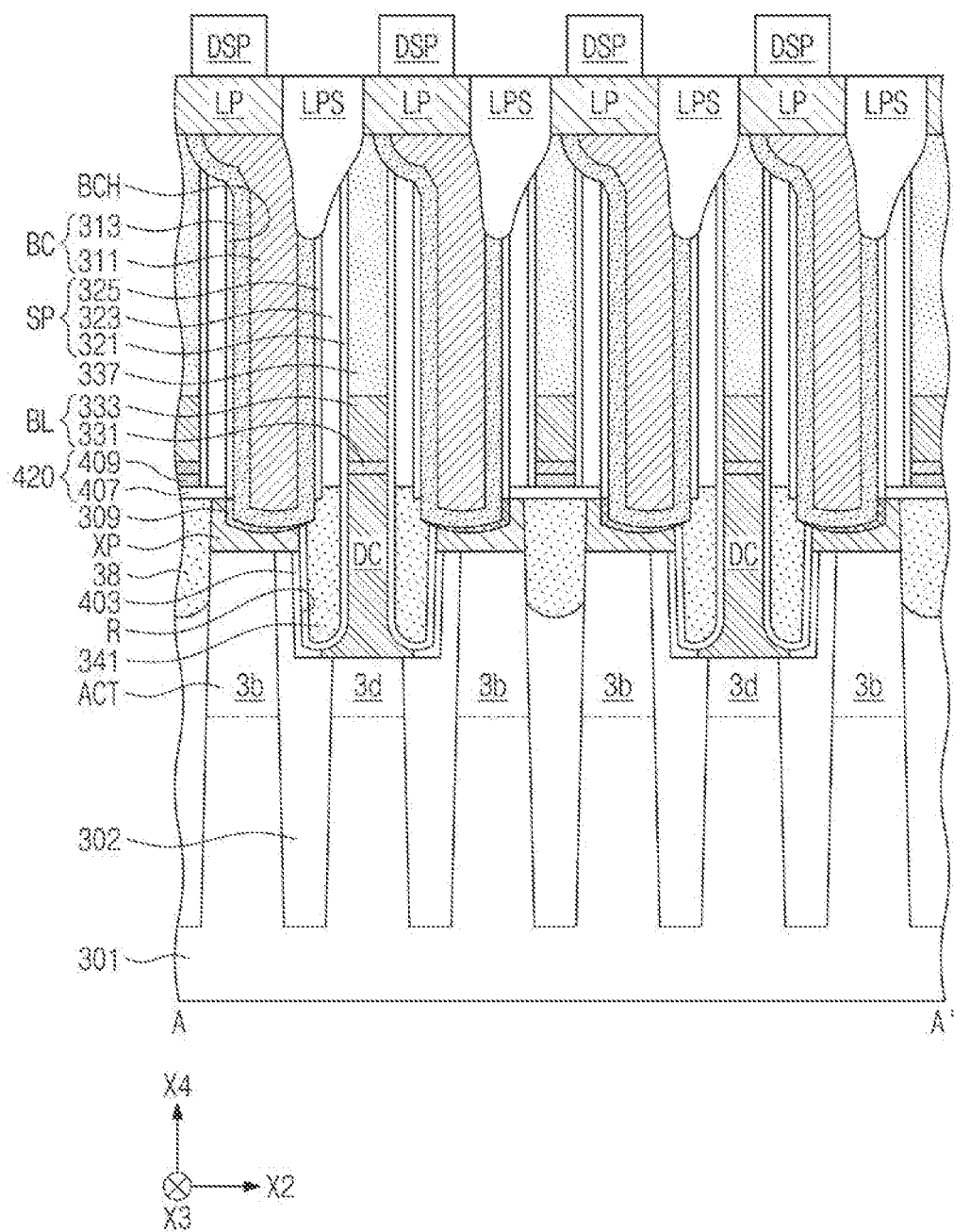
FIG. 2C is a cross-sectional view taken along the line A-A' of FIG. 1 according to an example embodiment.

FIG. 2C is a cross-sectional view taken along the line A-A' of FIG. 1 according to an example embodiment. The semiconductor memory device of FIG. 2C may have substantially the same features as those described with reference to FIGS. 1, 2A, and 2B, and thus, an overlapping description thereof may be omitted.

Referring to FIG. 2C, when the semiconductor memory device 100 is measured in the second direction X2, a width of a lower portion of the bit line contact DC may be larger than a width of an upper portion. The lower portion of a bit line contact DC may fully cover the first impurity region 3d. The bit line contact DC may have a rounded portion near the lower portion. Accordingly, a lower portion of the spacer liner 321 may also be rounded.

The first contact insulating pattern 403 may be interposed between the device isolation patterns 302 and the gapfill insulating pattern 341. An end portion of the first contact insulating pattern 403 may be adjacent to the bit line contact DC, and an opposite end portion may be adjacent to the storage node pad XP. A portion of the spacer liner 321 may be interposed between the first contact insulating pattern 403 and the gapfill insulating pattern 341.

FIGS. 3A, 3B, 3C, 3D, 3E, 3F, 3G, 3H, 3I, 3J and 3K are cross-sectional views sequentially illustrating a process of fabricating a semiconductor memory device, according to an example embodiment.

Figure 3A:
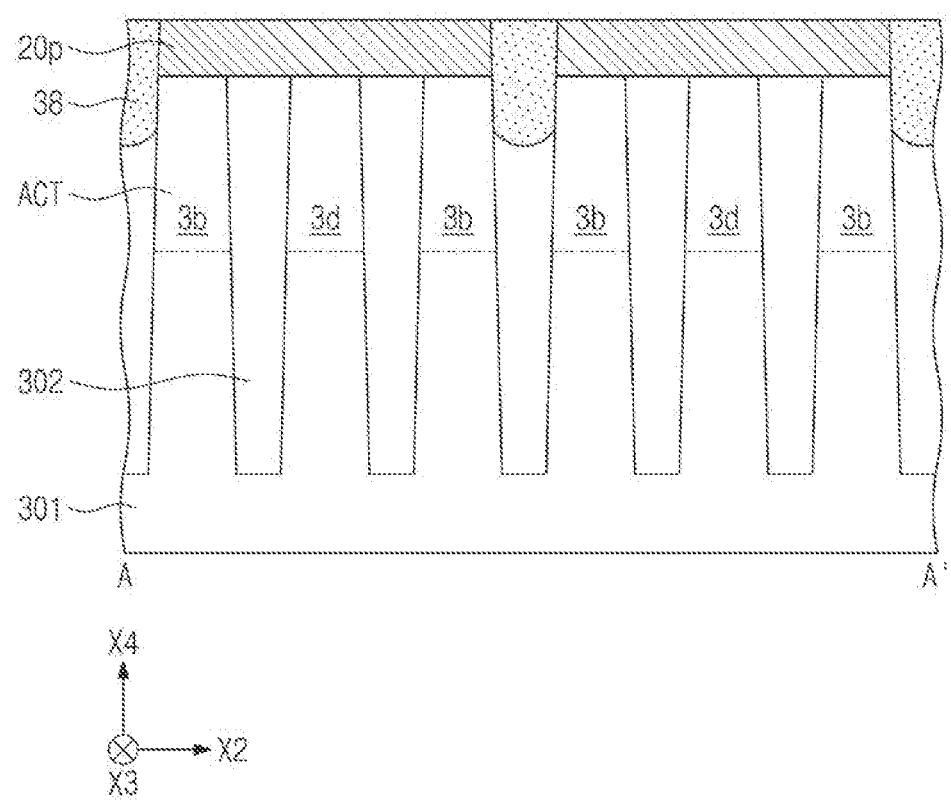
FIGS. 3A, 3B, 3C, 3D, 3E, 3F, 3G, 3H, 3I, 3J and 3K are cross-sectional views sequentially illustrating a process of fabricating a semiconductor memory device, according to an example embodiment.

Referring to FIG. 3A, the device isolation patterns 302 may be formed in the substrate 301. Accordingly, the active portions ACT may be defined. In detail, a device isolation trench may be formed in the substrate 301, and the device isolation patterns 302 may be formed to fill the device isolation trench.

The active portions ACT and the device isolation patterns 302 may be patterned to form grooves. The word lines WL may be formed in the grooves, respectively (e.g., see FIG. 2B). Each pair of the word lines WL may be formed to cross each of the active portions ACT. Before the forming of the word lines WL, the gate dielectric layer may be formed on inner surfaces of the grooves. The word lines WL may be recessed to have top surfaces that are lower than top surfaces of the active portions ACT. An insulating layer (e.g., a silicon nitride layer) may be formed on the substrate 301 to fill the grooves and may be etched to form the word line capping pattern 310 on each of the word lines WL. The first impurity region 3b and the second impurity region 3d may be formed by injecting impurities into the active portions ACT using the word line capping patterns 310 and the device isolation pattern 302 as a mask.

A conductive layer may be formed on the substrate 301. In an embodiment, the conductive layer may be a doped poly-silicon layer. The conductive layer may be etched to form conductive patterns 20p and gap regions therebetween. The gap regions may be formed to partially expose the device isolation pattern 302, the active portions ACT, and the gate dielectric layer. A pad separation layer may be formed to fill the gap regions, and an etch-back process may be performed to form the pad separation pattern 38 in the gap region. The pad separation pattern 38 may have a lattice shape, when viewed in a plan view.

Figure 3B:
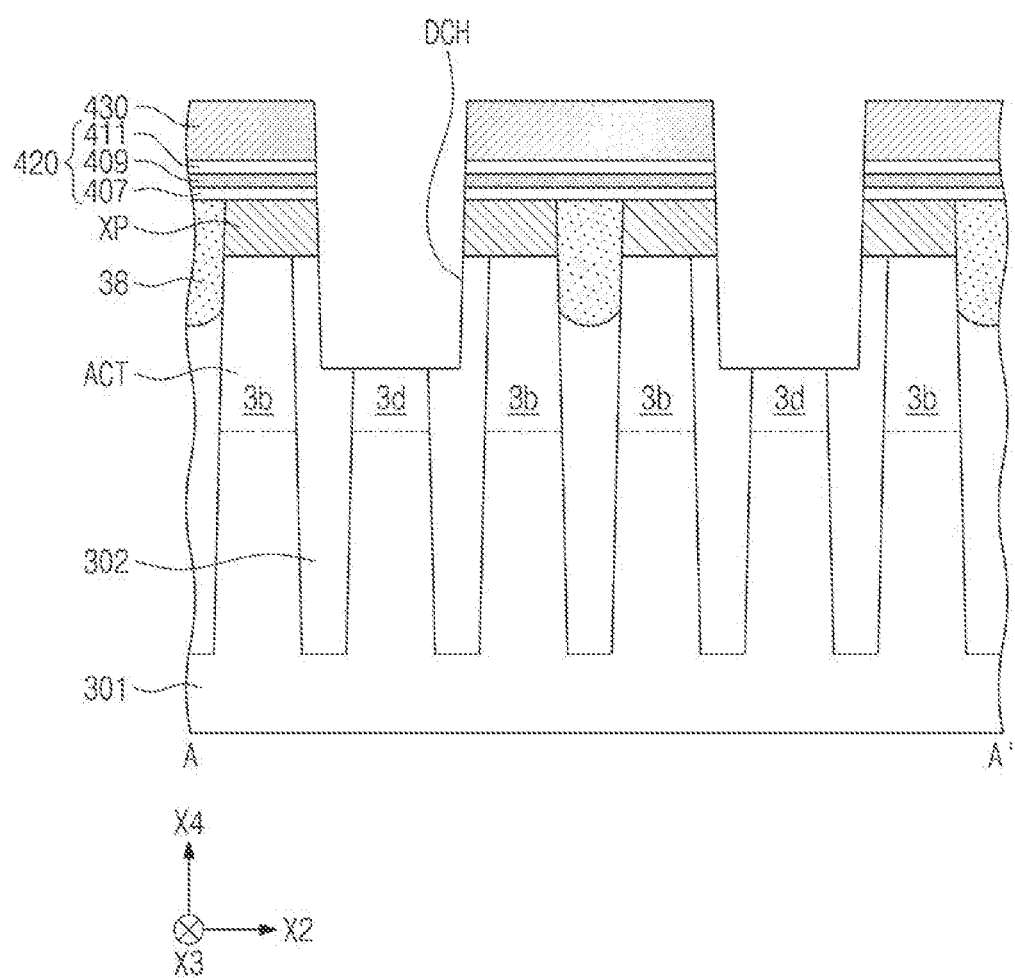

Referring to FIG. 3B, first to third interlayer insulating layers may be sequentially stacked on the conductive patterns 20p and the pad separation pattern 38. In an embodiment, the first interlayer insulating layer may be formed of or include silicon oxide, the second interlayer insulating layer may be formed of or include silicon nitride, and the third interlayer insulating layer may be formed of or include silicon oxide. A mask pattern 430 may be formed on the third interlayer insulating layer. A thickness of the mask pattern 430 may be larger than a total thickness of the first to third interlayer insulating layers. The mask pattern 430 may be formed of or include polysilicon or silicon nitride.

Contact holes DCH may be formed to expose the first impurity region 3d by etching the first to third interlayer insulating layers on the first impurity region 3d using the mask pattern 430 as an etch mask. As a result of the etching of the first to third interlayer insulating layers, the interlayer insulating pattern 420 including the first interlayer insulating pattern 407, the second interlayer insulating pattern 409, and the third interlayer insulating pattern 411 may be formed. The conductive patterns 20p, which are adjacent to the pad separation pattern 38, may also be etched to form the storage node pads XP.

Figure 3C:
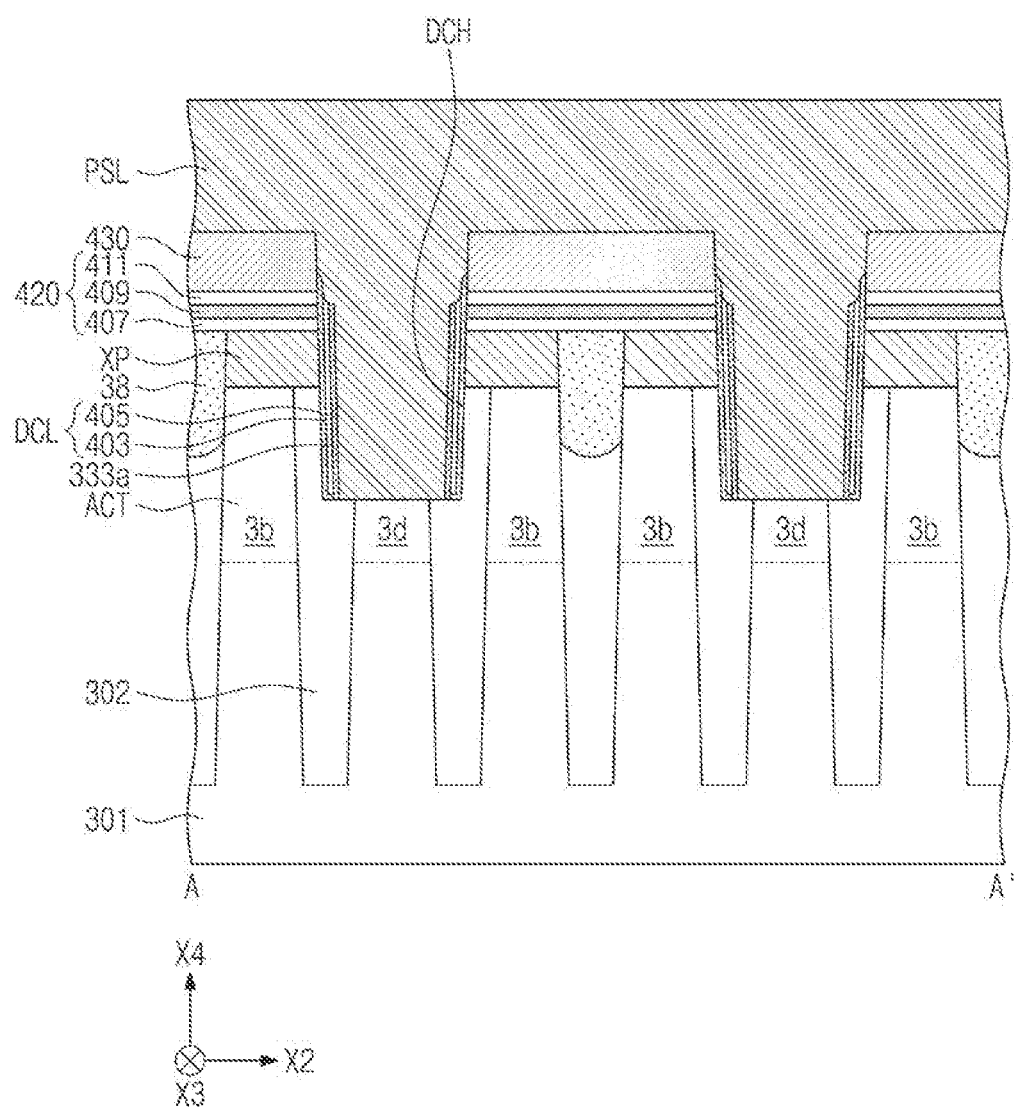

Referring to FIG. 3C, a contact insulating layer and a sacrificial layer may be sequentially and conformally formed on the substrate 301, and, an anisotropic etching process may be performed on the contact insulating layer and the sacrificial layer to form the first contact insulating pattern 403 and the second contact insulating pattern 405 sequentially covering inner side surfaces of the contact holes DCH. The first insulating pattern 403 and the second contact insulating pattern 405 may be formed of or include materials having an etch selectivity with respect to each other. For example, the first contact insulating pattern 403 may be formed of or include silicon nitride, and the second contact insulating pattern 405 may be formed of or include silicon oxide. Thereafter, a polysilicon spacer 333a may be formed on the second contact insulating pattern 405. In detail, the polysilicon spacer 333a may be formed by forming a polysilicon liner and etching the polysilicon liner.

Thereafter, a poly-silicon layer PSL may be formed on the substrate 301. The poly-silicon layer PSL may be doped with impurities. The poly-silicon layer PSL may fill the contact hole DCH.

Figure 3D:
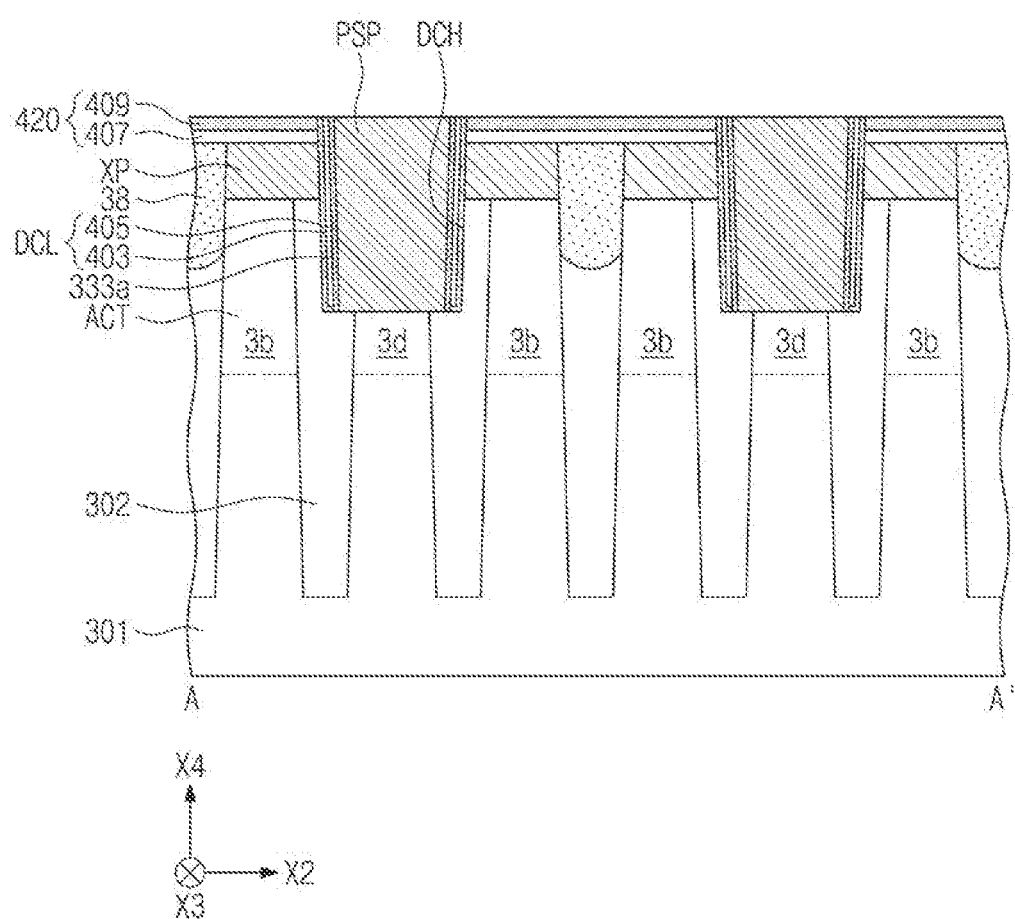

Referring to FIG. 3D, at least a portion of the poly-silicon layer PSL may be removed by an etch-back process. As a result of the etching process of the poly-silicon layer PSL, a polysilicon pattern PSP may be formed.

The mask pattern 430 may be removed, and the third interlayer insulating pattern 411 may be removed. In addition, a wet cleaning or etching process may be performed to remove protruding portions of the first contact insulating pattern 403 and the second contact insulating pattern 405.

Figure 3E:
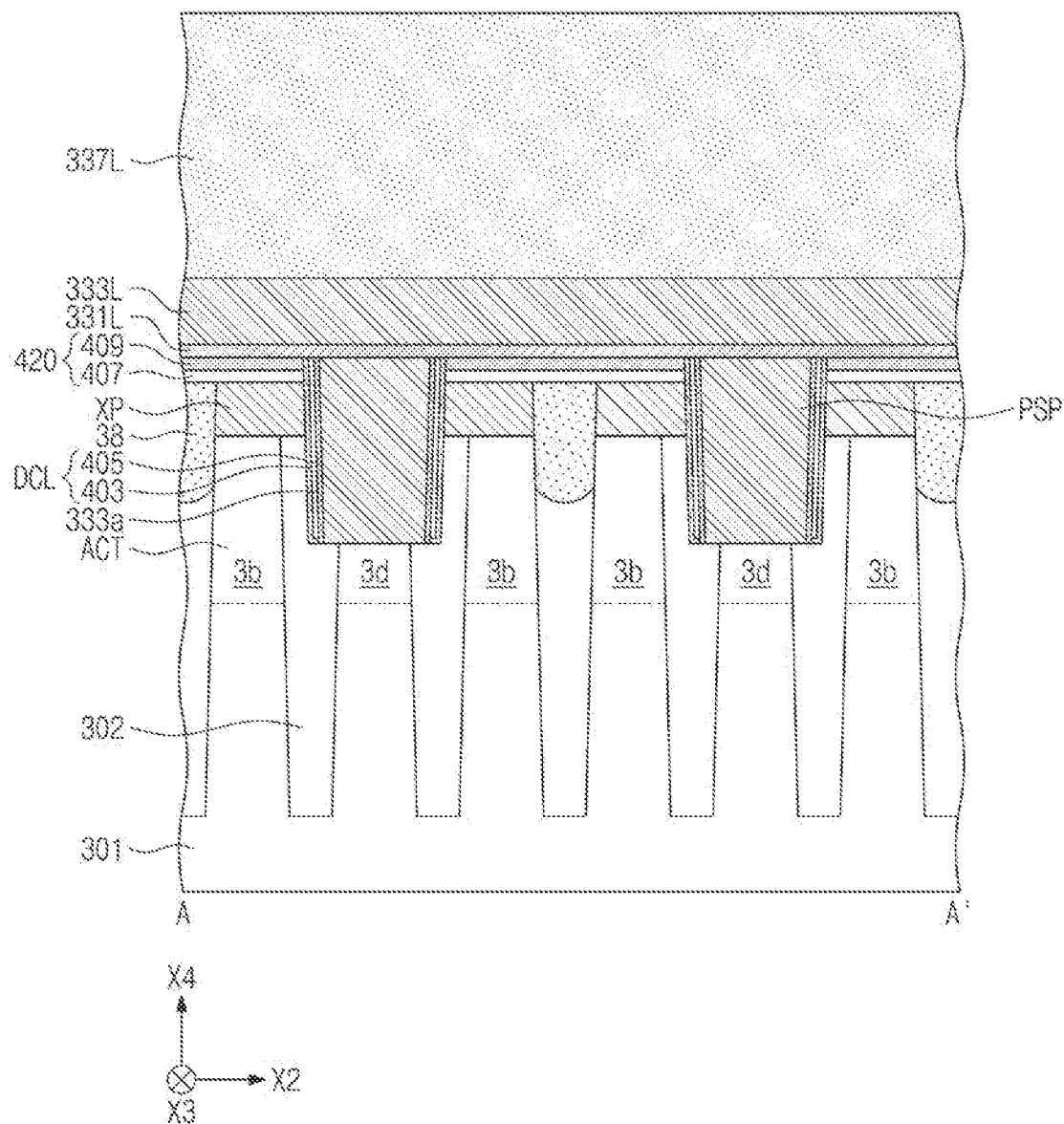

Referring to FIG. 3E, a bit line diffusion barrier layer 331L, a bit line interconnection layer 333L, and a bit line capping layer 337L may be sequentially formed. The bit line diffusion barrier layer 331L may be formed to have a bottom surface that is coplanar with a top surface of the polysilicon pattern PSP and a top surface of the second interlayer insulating pattern 409.

Figure 3F:
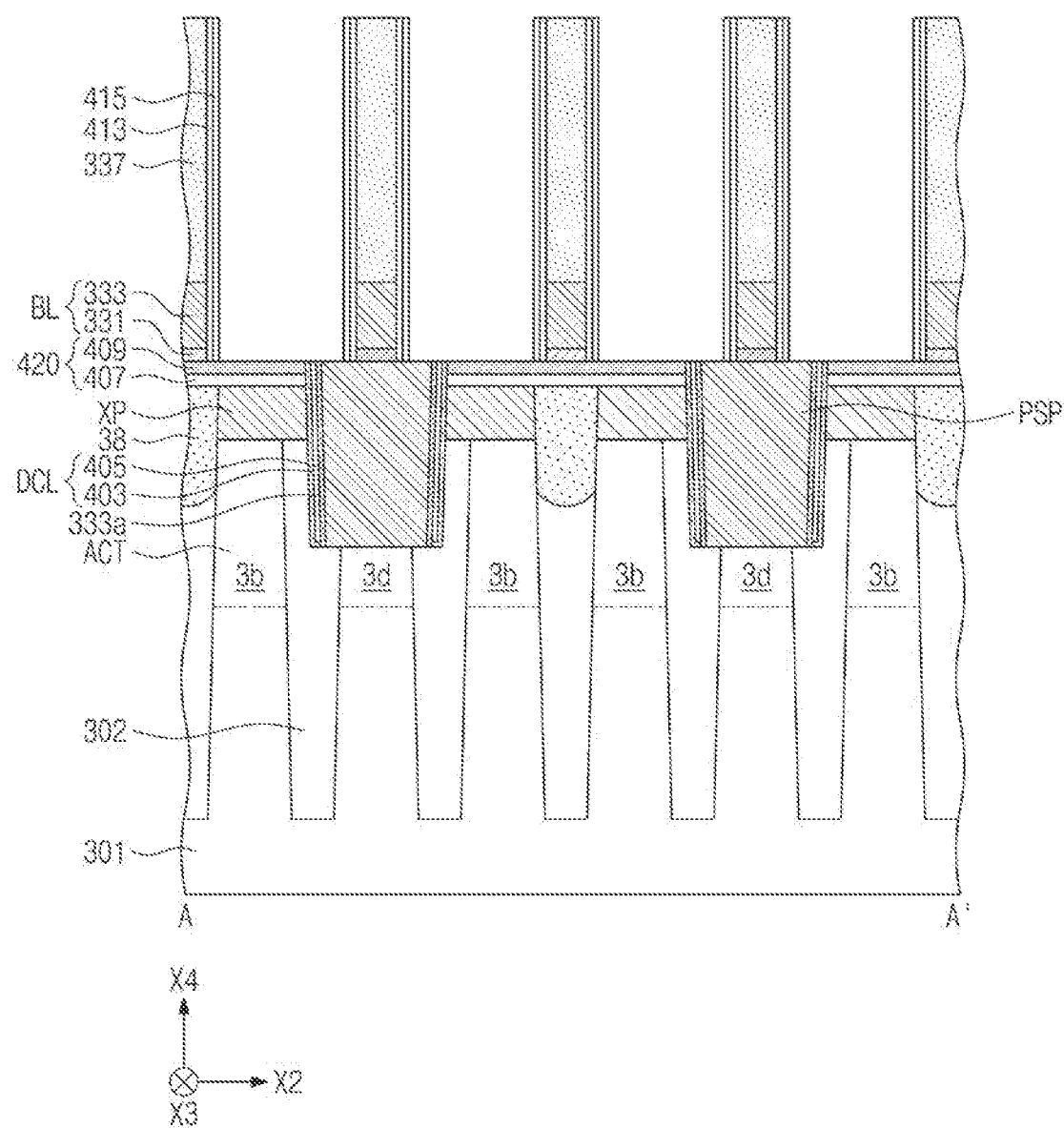

Referring to FIG. 3F, the bit line capping layer 337L, the bit line interconnection layer 333L, and the bit line diffusion barrier layer 331L may be sequentially etched to expose the top surface of the second interlayer insulating pattern 409 and to form the bit line capping pattern 337 and the bit line BL. Below the bit line BL, there may be the polysilicon pattern PSP filling the contact hole DCH. The polysilicon pattern PSP may be referred to as a preliminary bit line contact PSP. A first protection spacer 413 and a second protection spacer 415 may be formed to sequentially cover side surfaces of the bit line capping pattern 337 and the bit line BL. The first protection spacer 413 and the second protection spacer 415 may be formed of or include materials having an etch selectivity with respect to each other. The second protection spacer 415 may be formed of or include the same material as the second contact insulating pattern 405. The first protection spacer 413 may be formed of or include a material having an etch selectivity with respect to the bit line capping pattern 337 and the second interlayer insulating pattern 409. In an embodiment, the first protection spacer 413 may be formed of or include silicon oxycarbide.

Figure 3G:
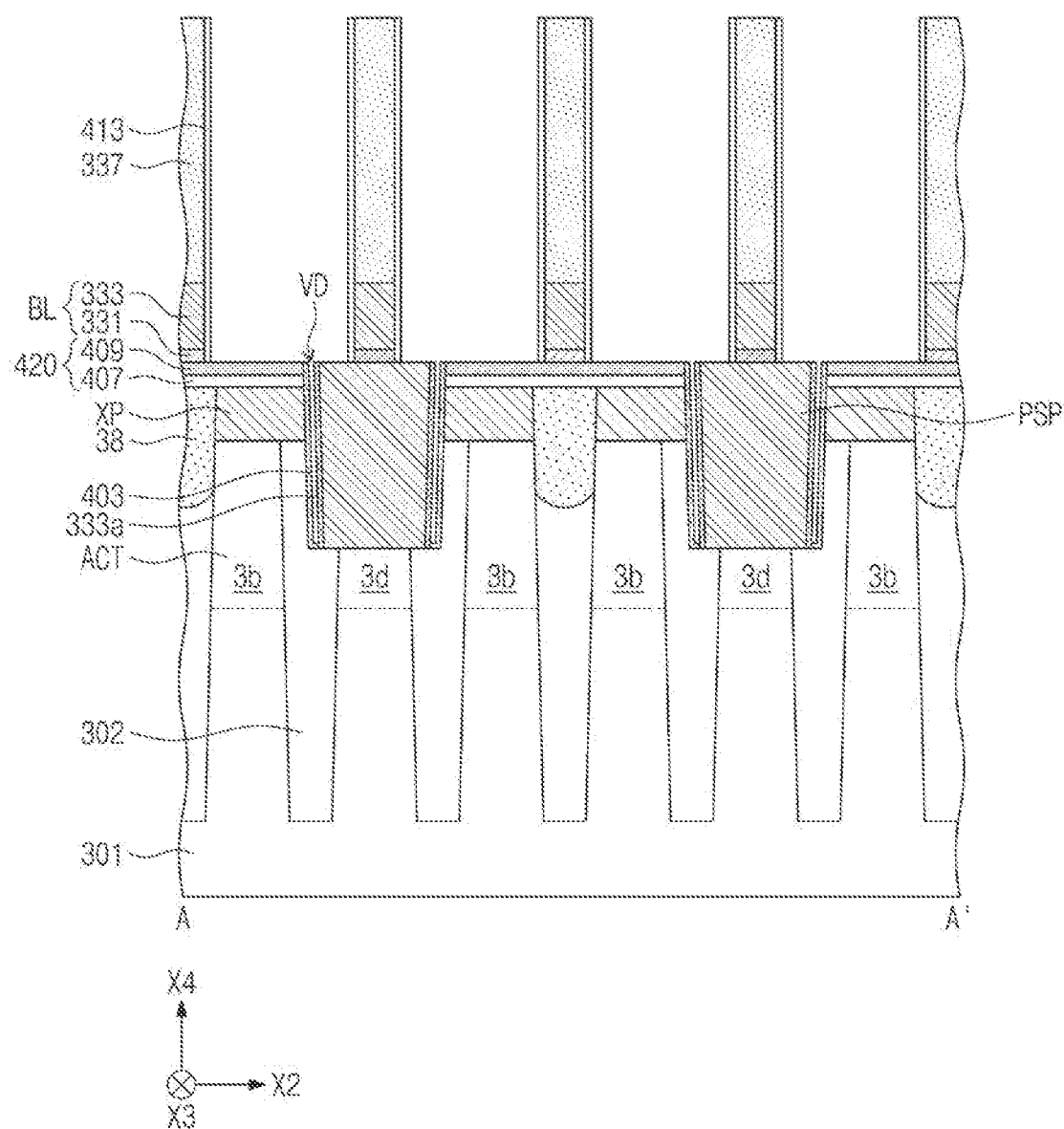

Referring to FIG. 3G, the second contact insulating pattern 405 may be removed to form a void region VD between the preliminary bit line contact PSP and the first contact insulating pattern 403. In this step, the second protection spacer 415, which is formed of the same material as the second contact insulating pattern 405, may also be removed. Thus, a side surface of the first protection spacer 413 may be exposed. The first protection spacer 413 may protect the bit line capping pattern 337 and the bit line BL.

Figure 3H:
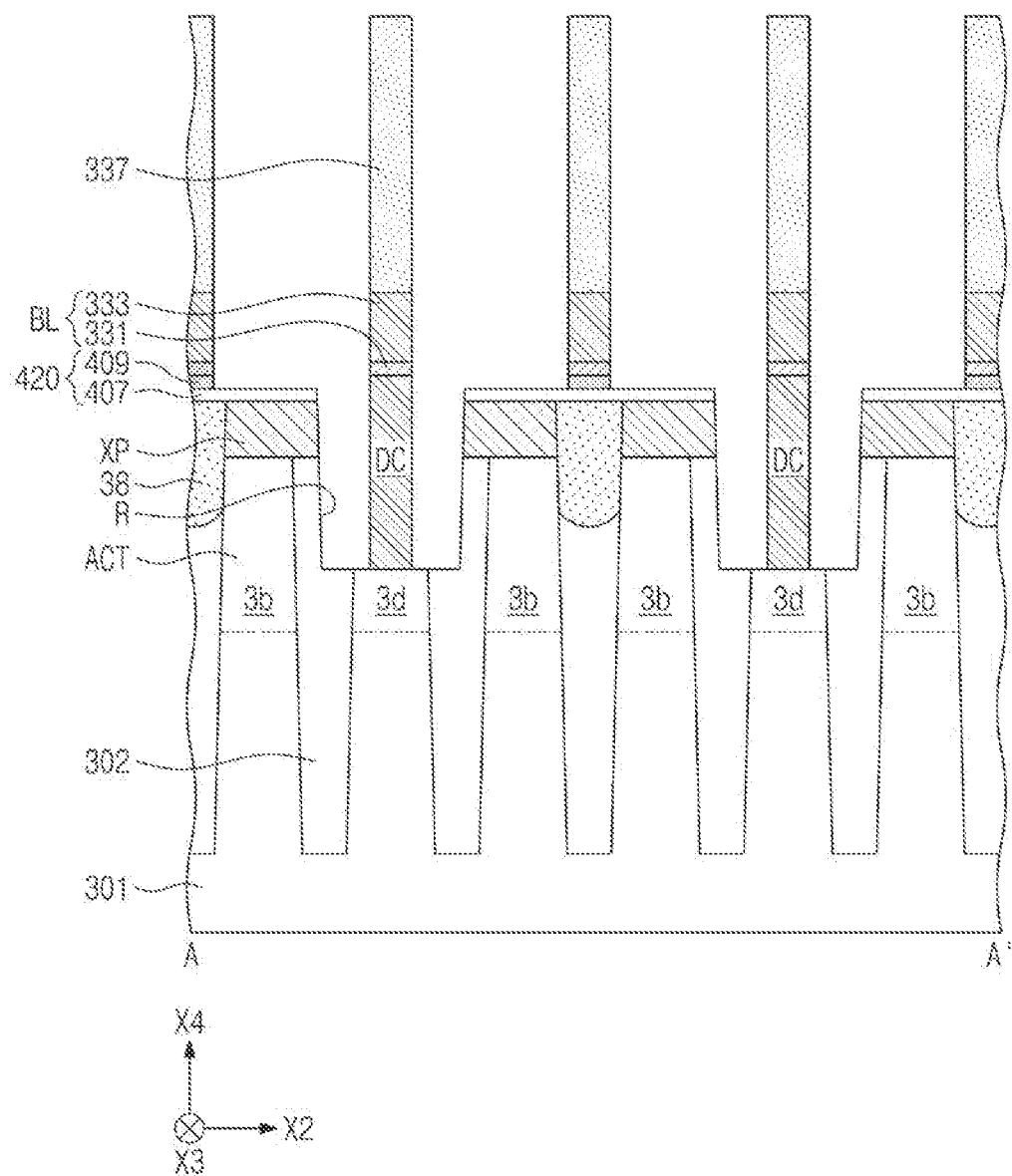

Referring to FIGS. 3G and 3H, the first protection spacer 413 may be removed. The bit line contact DC may be formed by etching the preliminary bit line contact PSP using the bit line capping pattern 337 as an etch mask. Due to the presence of the void region VD, an etchant, which is used to etch the preliminary bit line contact PSP, mat be easily supplied into the contact hole DCH, and thus, the bit line contact DC may be formed to have a uniform width regardless of a vertical height. The first contact insulating pattern 403 may protect the storage node pad XP and may prevent the storage node pad XP from being etched. In an embodiment, the first contact insulating pattern 403 covering a side surface of the storage node pad XP may be removed during the etching process. During the etching process, the second interlayer insulating pattern 409 may also be etched to expose a top surface of the first interlayer insulating pattern 407.

Figure 3I:
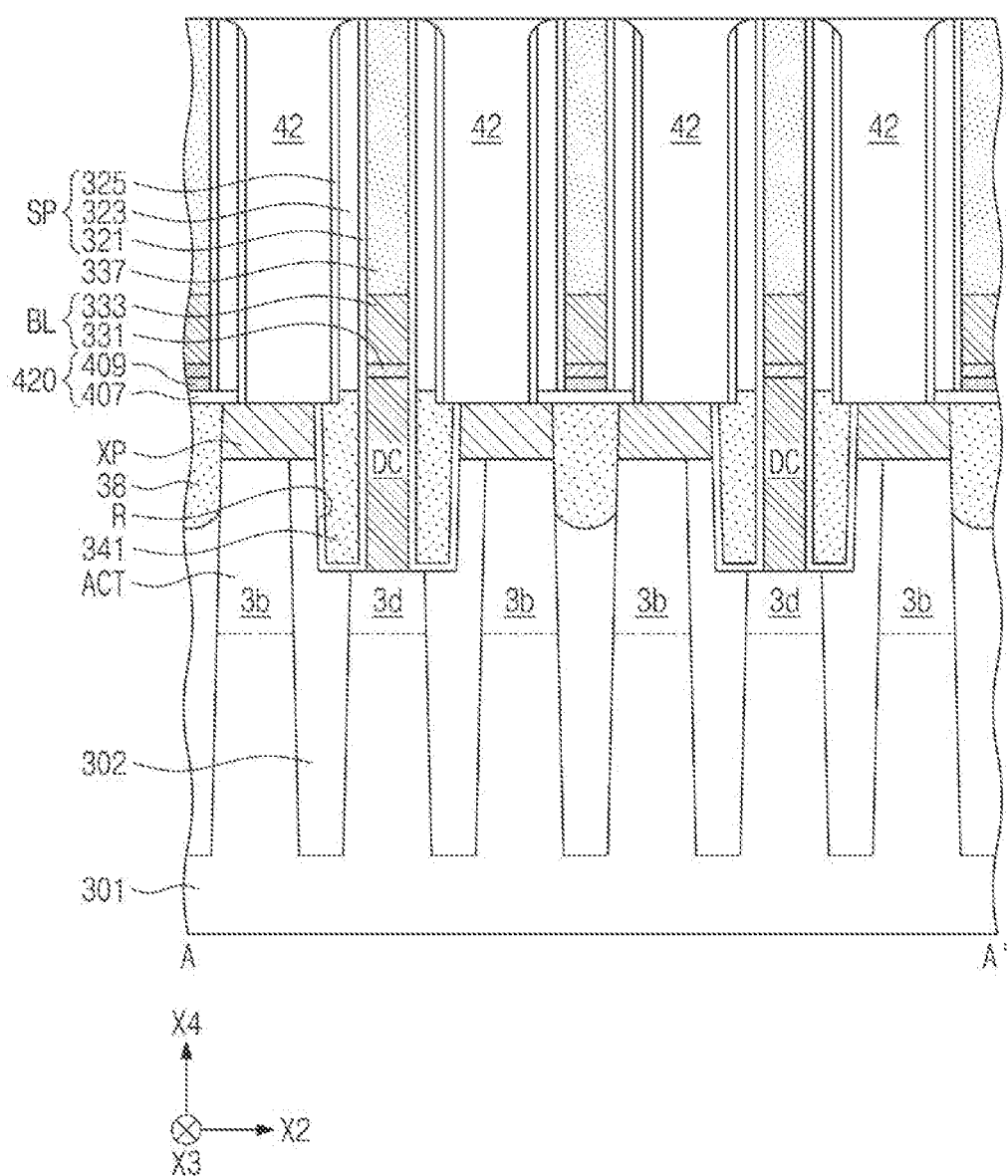

Referring to FIG. 3I, the spacer liner 321 may be formed on the substrate 301 to conformally cover the structure with the bit line contact DC. An insulating gapfill layer (not shown) may be formed on the spacer liner 321 to fill the contact hole DCH. The gapfill insulating pattern 341 may be formed in the contact hole DCH by performing an etch-back process on the insulating gapfill layer. A first spacer layer may be conformally formed on the substrate 301 and may be etched-back to form the first spacer 323 covering a side surface of the spacer liner 321. The first interlayer insulating pattern 407 may also be etched to expose top surfaces of the storage node pads XP. In addition, the gapfill insulating pattern 341 and the spacer liner 321 may be partially exposed. A second spacer layer may be conformally formed on the substrate 301 and may be etched-back to form the second spacer 325 covering a side surface of the first spacer 323. As a result, the bit line spacer SP may be formed. A sacrificial gap-filling layer may be formed on the substrate 301 to fill spaces between the bit lines BL, and thus, sacrificial gapfill patterns 42 may be formed between the bit lines BL. In an embodiment, the sacrificial gapfill patterns 42 may be formed of or include at least one of silicon oxide, tetraethyl orthosilicate, or tonen silazane. The sacrificial gapfill patterns 42 may be overlapped with the storage node pads XP. A node separation layer may be formed on the top surface of the substrate 301 to fill node separation holes and then may be etched-back to form the node separation patterns. The node separation patterns may be formed of or include, for example, silicon oxide.

Figure 3J:
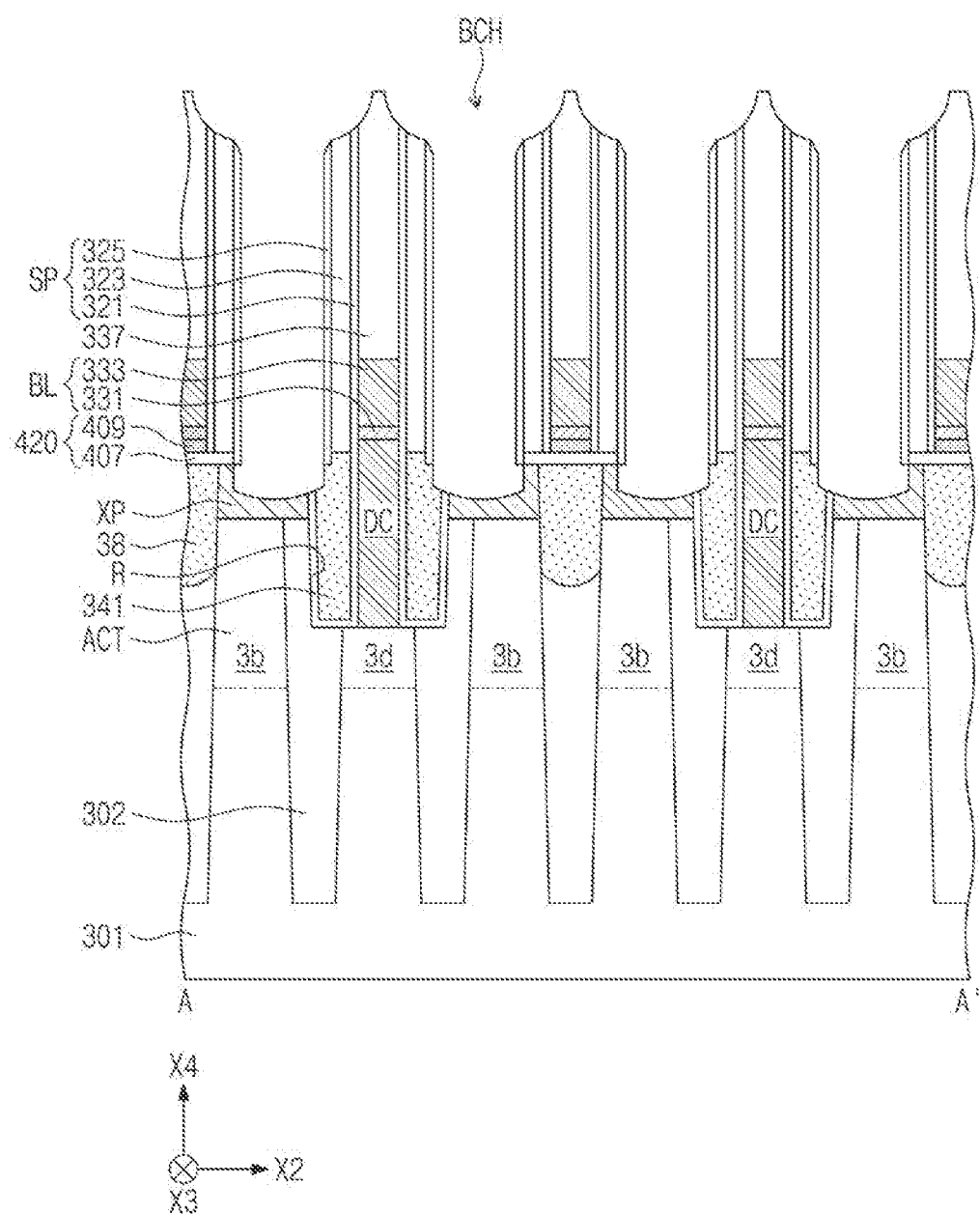

Referring to FIG. 3J, the sacrificial gapfill patterns 42, which are interposed between the bit lines BL, may be removed to expose the gapfill insulating pattern 341 and the storage node pads XP. An etching process may be performed to etch the gapfill insulating pattern 341 and portions of the storage node pads XP between the bit lines BL, and as a result, the storage node contact hole BCH may be formed to expose the storage node pads XP.

Figure 3K:
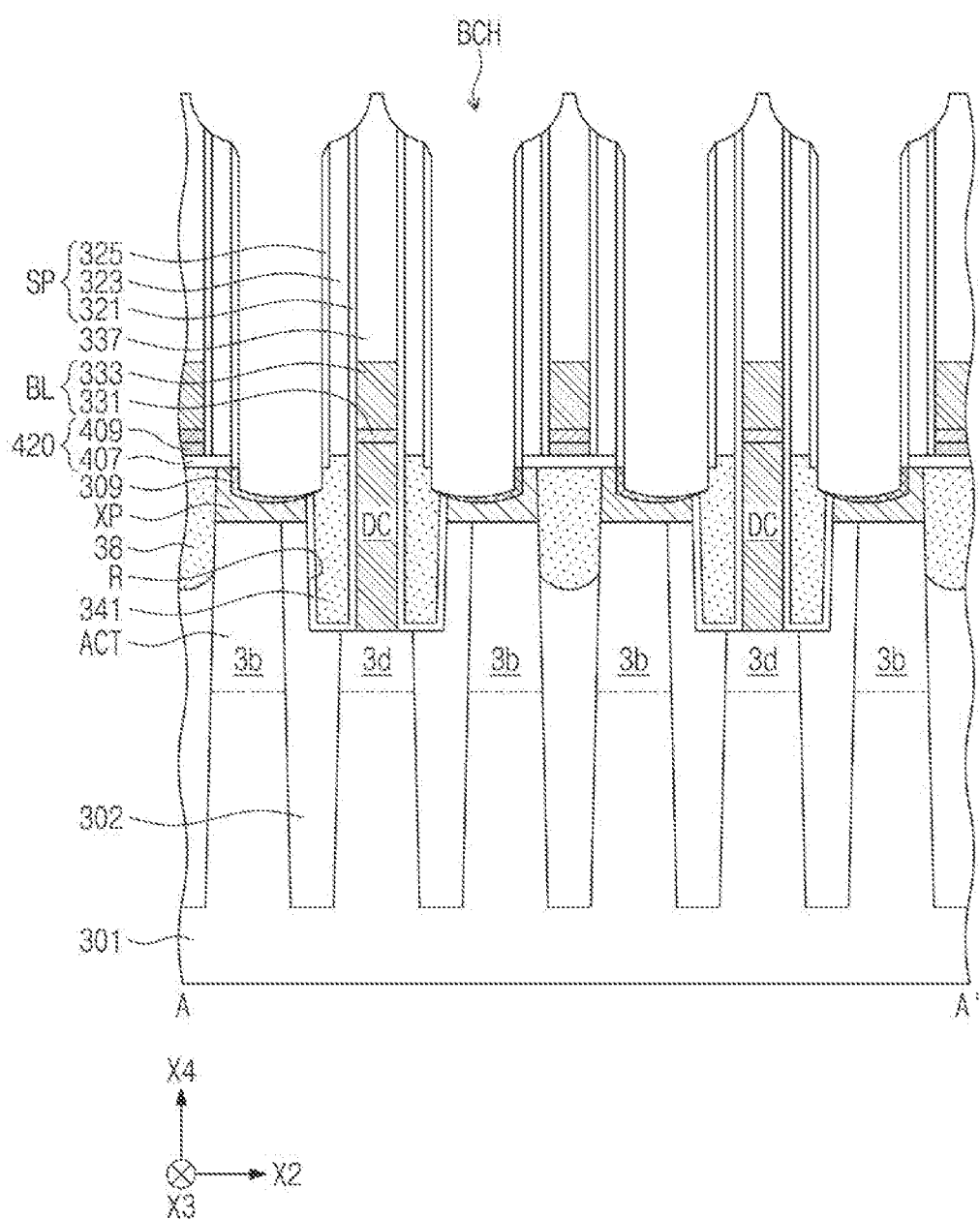

Referring to FIG. 3K, the first ohmic contact layer 309 may be formed on the storage node pads XP and in the storage node contact hole BCH. The first ohmic contact layer 309 may be formed by a deposition process. In detail, the first ohmic contact layer 309 may be formed by a chemical vapor deposition (CVD) method, a physical vapor deposition (PVD) method, or an atomic layer deposition (ALD) method. The first ohmic contact layer 309 may be formed of or include a two-dimensional material. As an example, the two-dimensional material may include at least one of graphene, transition metal dichalcogenides, or black phosphorus.

Referring to FIGS. 3K and 2A, a contact diffusion barrier layer may be conformally formed on the substrate 301, and a contact metal layer may be formed on the contact diffusion barrier layer to fill the storage node contact hole BCH. Both of the contact diffusion barrier layer and the contact metal layer may be formed of or include at least one of metallic materials and may be formed by a deposition process, which is performed at a lower temperature (e.g., of several hundreds of Celsius degrees, in particular, about 300-400° C.) than that in an annealing process (e.g., at a temperature of about 1000° C.), and in this case, the processes disclosed herein may reduce a probability of a process failure occurring and/or prevent a process failure from occurring.

Thereafter, a CMP process may be performed to expose a top surface of the bit line capping pattern 337 and to form the contact diffusion prevention pattern 313 and the contact metal pattern 311. The contact diffusion prevention pattern 313 may include a portion of the contact diffusion barrier layer. The contact metal pattern 311 may include a portion of the contact metal layer. The contact diffusion prevention pattern 313 and the contact metal pattern 311 may form the storage node contact BC. A conductive layer may be formed on the storage node contact BC and the bit line capping pattern 337 and then may be etched to form the landing pads LP and trenches between the landing pads LP. Landing pad separation patterns LPS may be formed by filling the trenches with an insulating layer and performing an etchback or CMP process on the insulating layer. The data storage patterns DSP may be formed on the landing pads LP. Thus, the semiconductor memory device 100 may be fabricated.

Figure 4A:
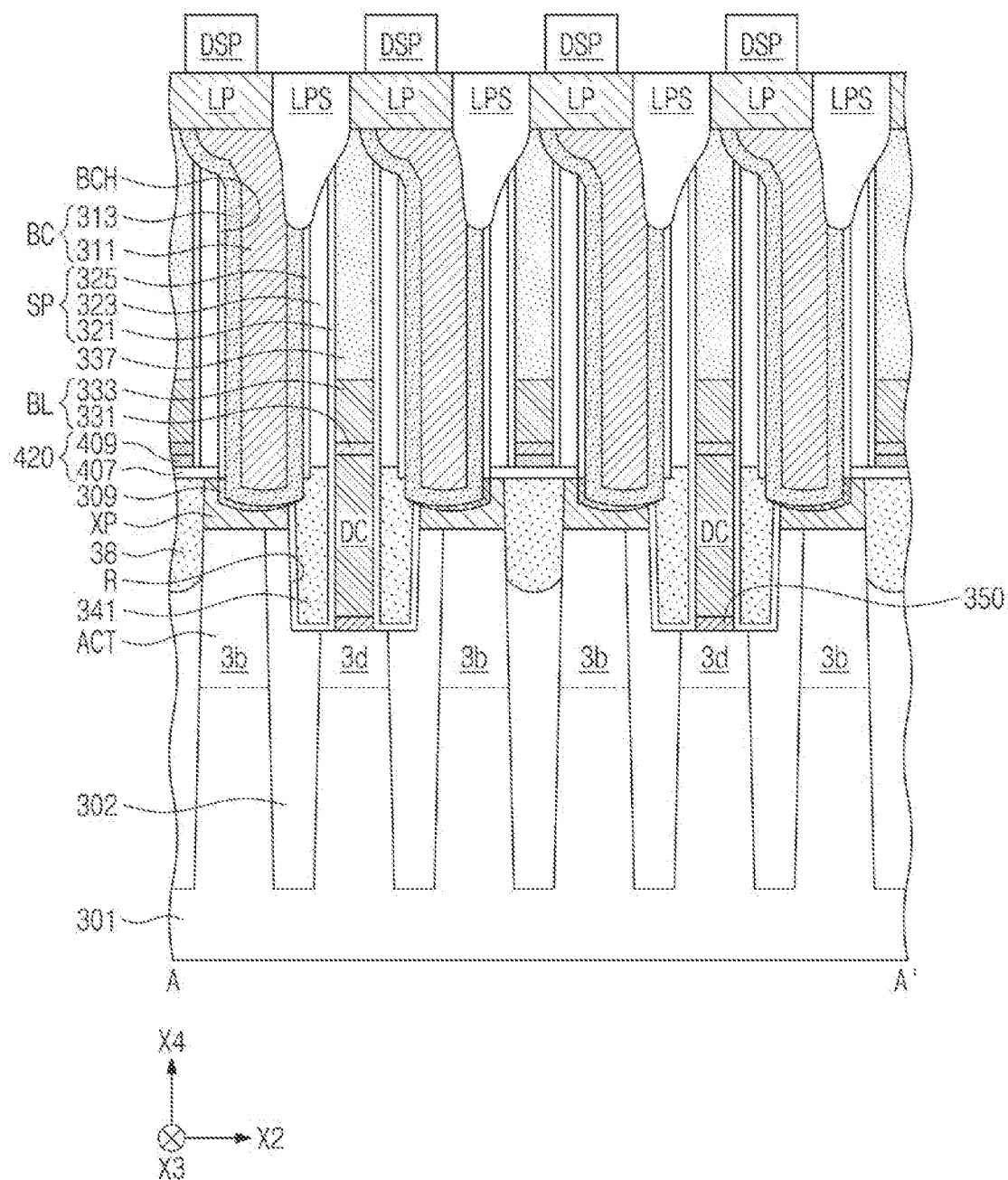
FIGS. 4A and 4B are cross-sectional views, which are taken along the lines A-A' and B-B', respectively, of FIG. 1 illustrating a semiconductor memory device according to an example embodiment.
Figure 4B:
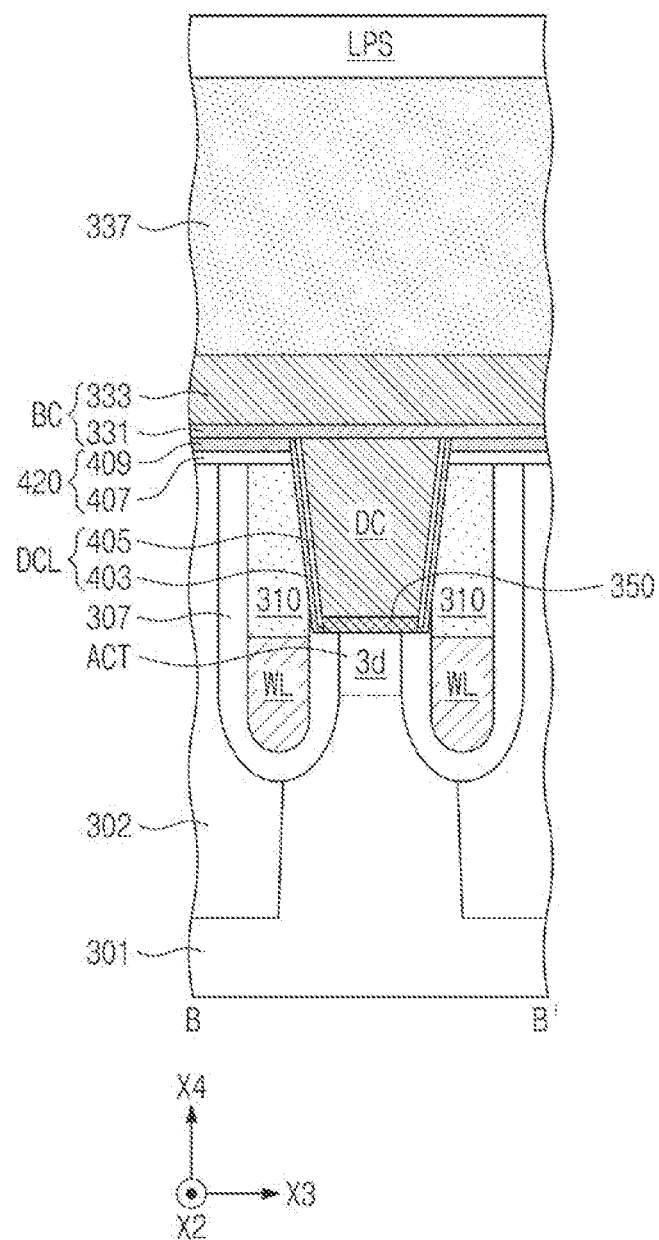

FIGS. 4A and 4B are cross-sectional views, which are taken along the lines A-A' and B-B', respectively, of FIG. 1 illustrating a semiconductor memory device according to an example embodiment. The semiconductor memory device according to FIGS. 4A and 4B may have substantially the same features as those described with reference to FIGS. 1, 2A, and 2B, and thus, an overlapping description thereof may be omitted.

Referring to FIGS. 4A and 4B, a semiconductor memory device 110 according to an embodiment of the disclosure may further include a second ohmic contact layer 350 which is interposed between the bit line contact DC and the first impurity region 3d. According to an embodiment of the disclosure, the bit line contact DC may be formed of or include at least one of metallic materials. For example, the bit line contact DC may be formed of or include at least one of tungsten, titanium, aluminum, copper, ruthenium, iridium, or molybdenum.

The second ohmic contact layer 350 may be interposed between the first impurity region 3d and the bit line contact DC. A side surface of the second ohmic contact layer 350 may be adjacent to a side surface of the contact insulating pattern DCL. The first impurity region 3d and the bit line contact DC may be spaced apart from each other in the fourth direction X4 with the second ohmic contact layer 350 interposed therebetween.

The second ohmic contact layer 350 may be formed of or include a two-dimensional material, like the first ohmic contact layer 309. The second ohmic contact layer 350 may be formed of or include at least one of graphene, transition metal dichalcogenides, or BP.

Since the bit line contact DC includes the metallic material and the second ohmic contact layer 350 is interposed between the first impurity region 3d and the bit line contact DC, an electrical resistance of a current path including the impurity region may be decreased. Accordingly, the reliability of the semiconductor device 110 may be improved.

Figure 5:
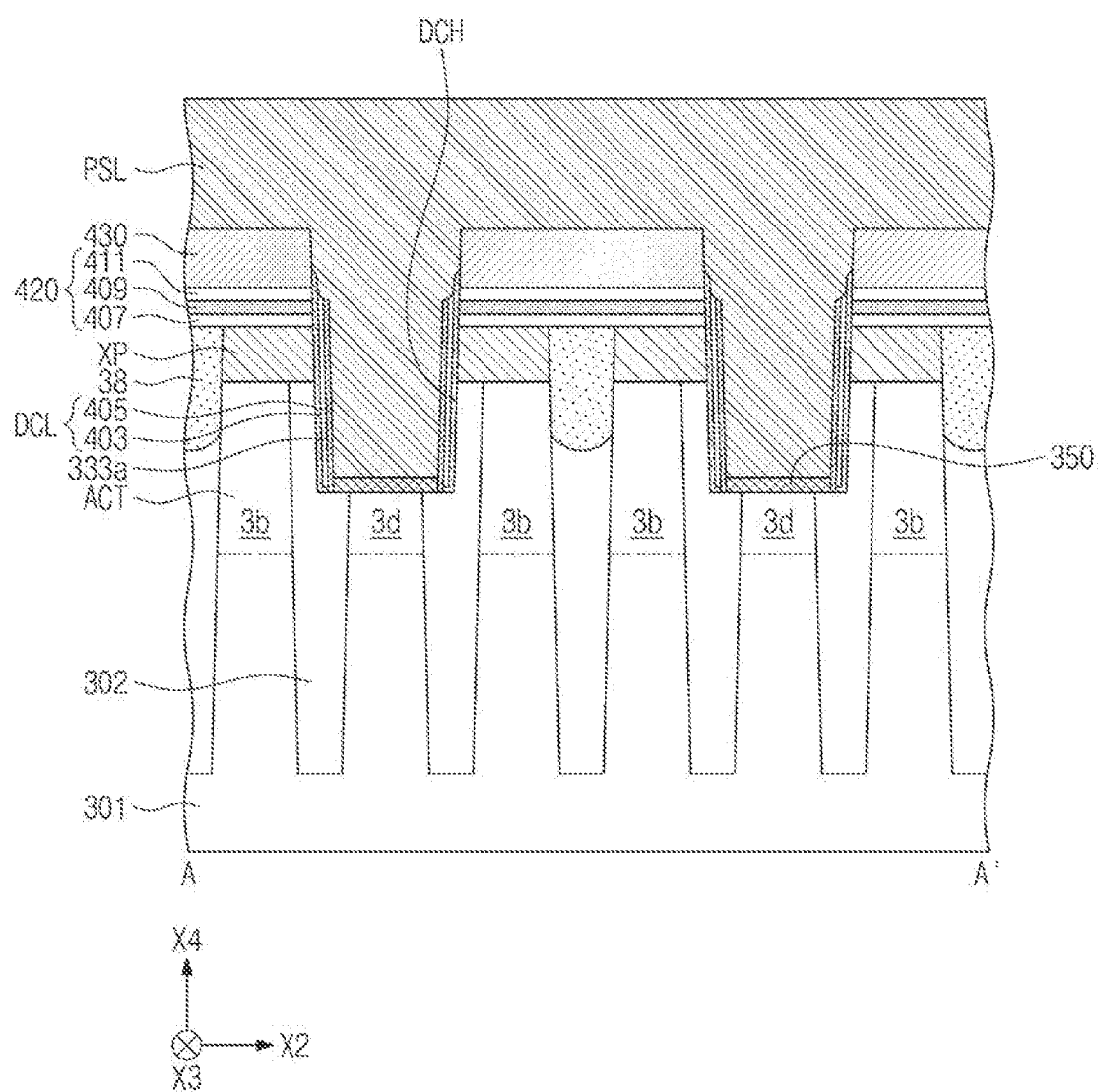
FIG. 5 is a cross-sectional view illustrating a process of fabricating the semiconductor memory device of FIG. 4A, according to an example embodiment.

FIG. 5 is a cross-sectional view illustrating a process of fabricating the semiconductor memory device of FIG. 4A, according to an example embodiment.

Referring to FIGS. 3C and 5, the second ohmic contact layer 350 may be formed to cover a bottom surface of the contact hole DCH, after forming the first contact insulating pattern 403, the second contact insulating pattern 405, and the polysilicon spacer 333a on a side surface of the contact hole DCH. The poly-silicon layer PSL may be formed on the second ohmic contact layer 350. The second ohmic contact layer 350 may be formed by forming a second ohmic contact layer and performing an etch-back process thereon. The second ohmic contact layer 350 may be formed to have a side surface that is adjacent to a side surface of the first contact insulating pattern 403 and a side surface of the second contact insulating pattern 405. A subsequent process may be performed in substantially the same manner as the process described with reference to FIGS. 3D to 3K.

Figure 6A:
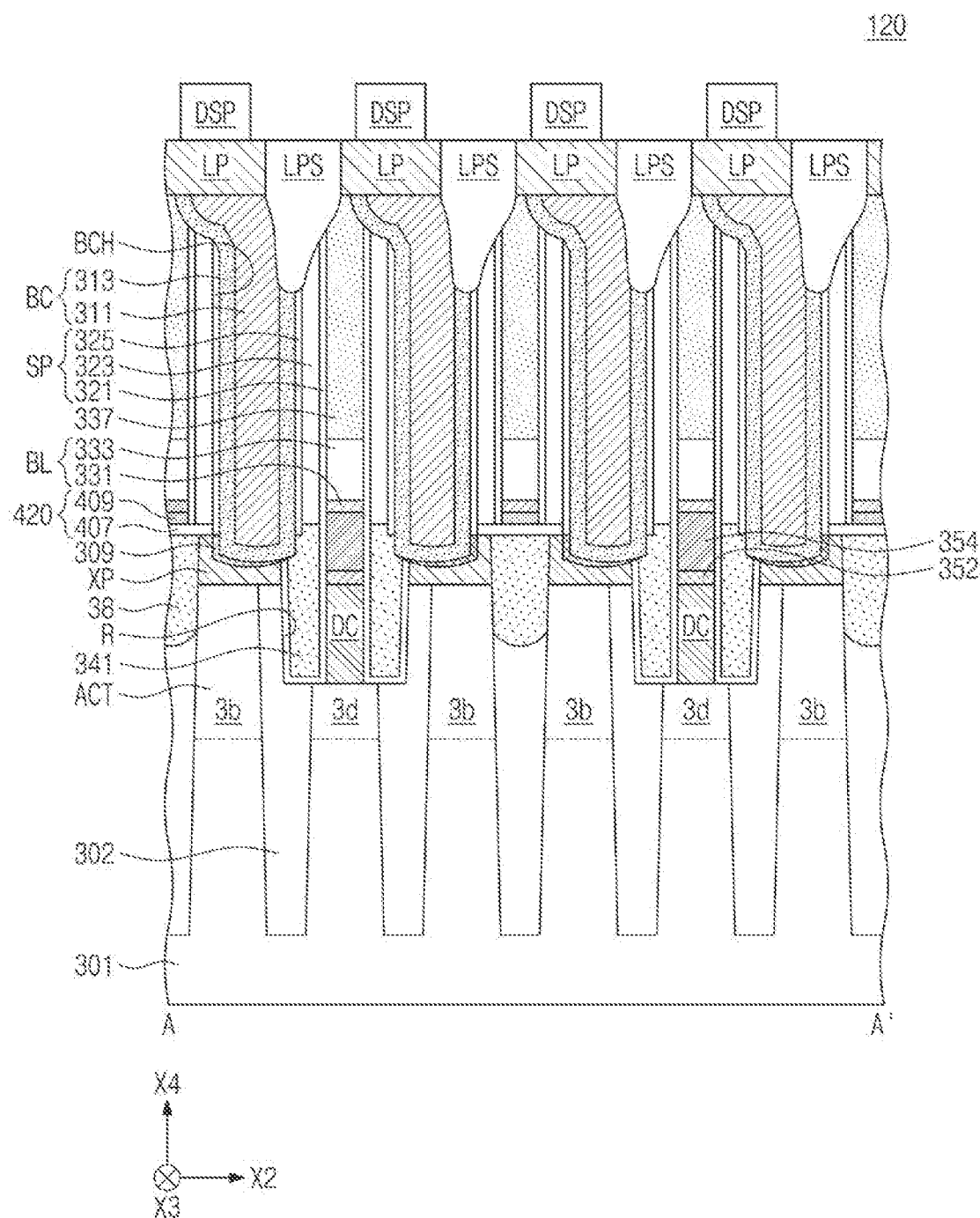
FIGS. 6A and 6B are cross-sectional views, which are taken along the lines A-A' and B-B', respectively, of FIG. 1 illustrating a semiconductor memory device according to an example embodiment.
Figure 6B:
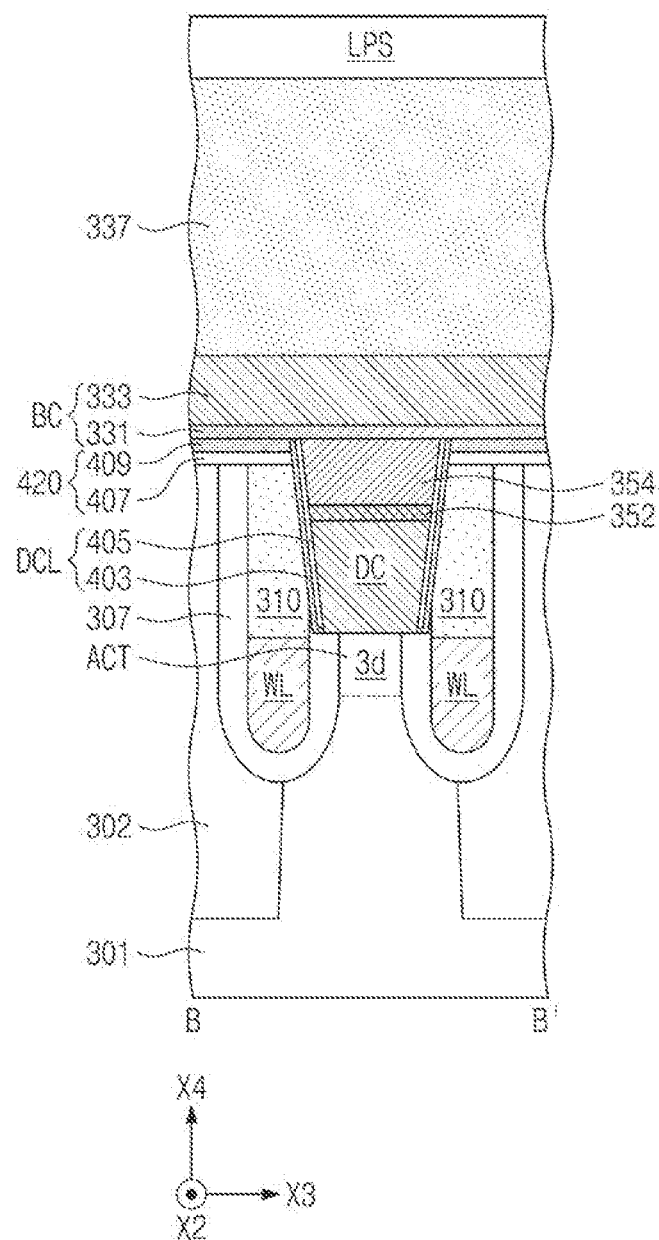

FIGS. 6A and 6B are cross-sectional views, which are taken along the lines A-A' and B-B', respectively, of FIG. 1 illustrating a semiconductor memory device according to an example embodiment. The semiconductor memory device according to FIGS. 6A and 6B may have substantially the same features as those described with reference to FIGS. 1, 2A, and 2B, and thus, an overlapping description thereof may be omitted.

A bit line metal pattern 354 may be interposed between the bit line contact DC and the bit line BL. A third ohmic contact layer 352 may be interposed between the bit line contact DC and the bit line metal pattern 354. A side surface of the third ohmic contact layer 352 and a side surface of the bit line metal pattern 354 may be adjacent to the side surface of the spacer liner 321. Furthermore, the side surface of the third ohmic contact layer 352 and the side surface of the bit line metal pattern 354 may be adjacent to the side surface of the contact insulating pattern DCL.

The third ohmic contact layer 352 may be formed of or include at least one of graphene, TMDC, or BP. The bit line metal pattern 354 may be formed of or include at least one of tungsten, titanium, aluminum, copper, ruthenium, iridium, or molybdenum.

Figure 7A:
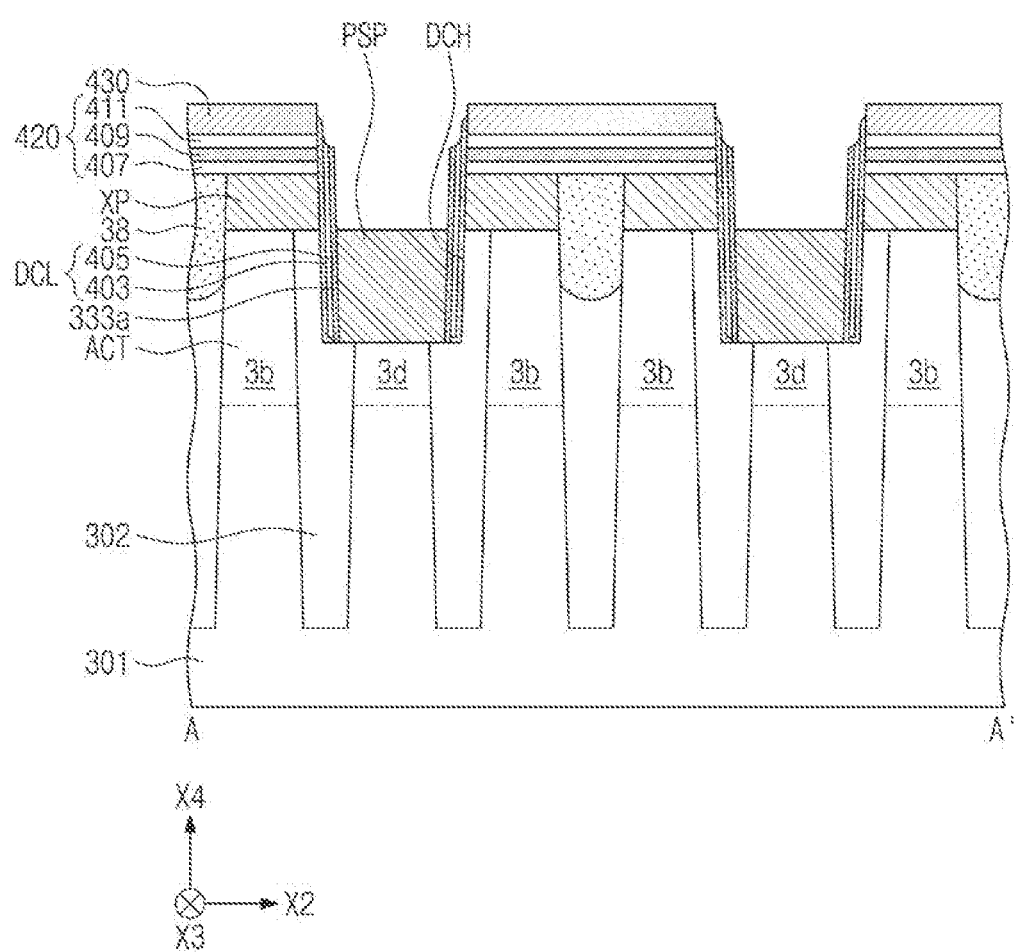
FIGS. 7A and 7B are cross-sectional views illustrating a process of fabricating the semiconductor memory device of FIG. 6A, according to an example embodiment.
Figure 7B:
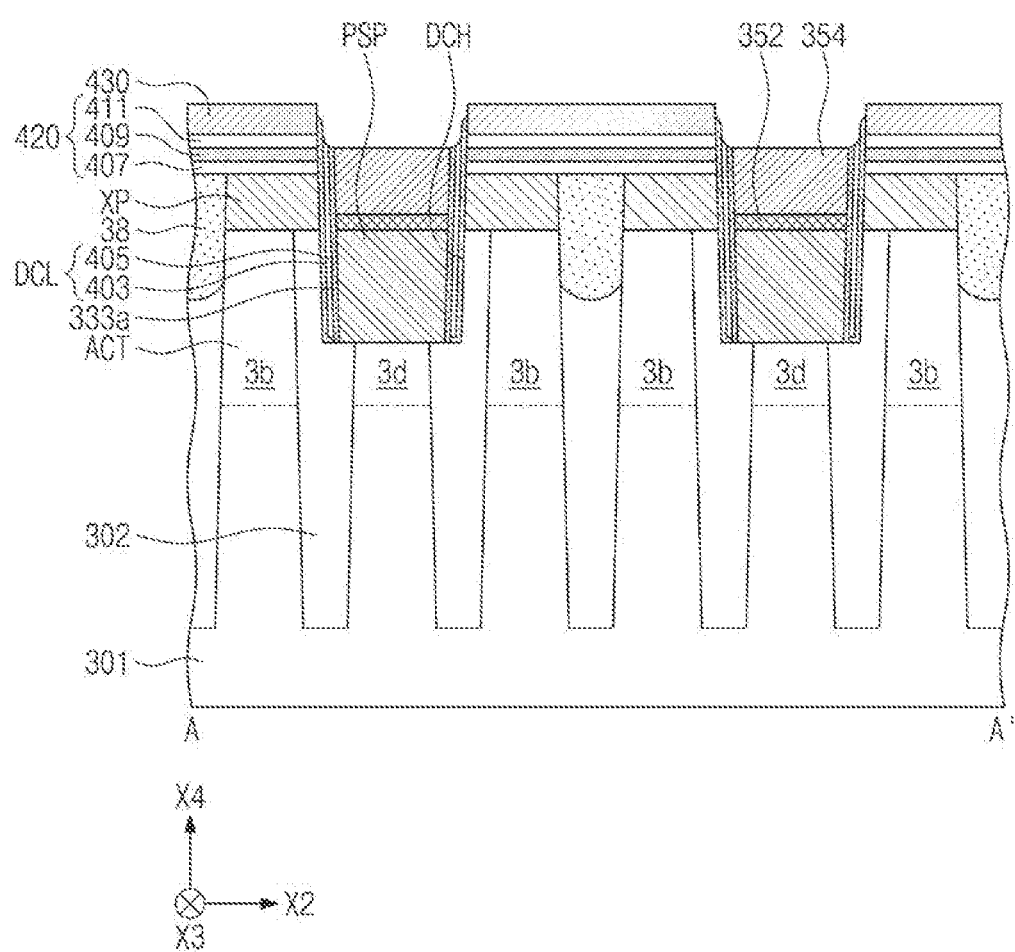

FIGS. 7A and 7B are cross-sectional views illustrating a process of fabricating the semiconductor memory device of FIG. 6A, according to an example embodiment.

Referring to FIGS. 3C, 3D, and 7A, by adjusting a process time of an etching process, place a top surface of the polysilicon pattern PSP may be placed at a level lower than the top surface of the polysilicon pattern PSP of FIG. 3D. The level of the top surface of the polysilicon pattern PSP may be adjusted in consideration of technical requirements for a semiconductor memory device 120.

Referring to FIG. 7B, the third ohmic contact layer 352 and the bit line metal pattern 354 may be sequentially formed on the polysilicon pattern PSP. The third ohmic contact layer 352 may be formed by depositing a third ohmic contact layer and performing an etch-back process thereon. The bit line metal pattern 354 may be formed by depositing a bit line metal layer and performing an etch-back process thereon. A subsequent process may be performed in substantially the same manner as the process described with reference to FIGS. 3D to 3K.

Figure 8:
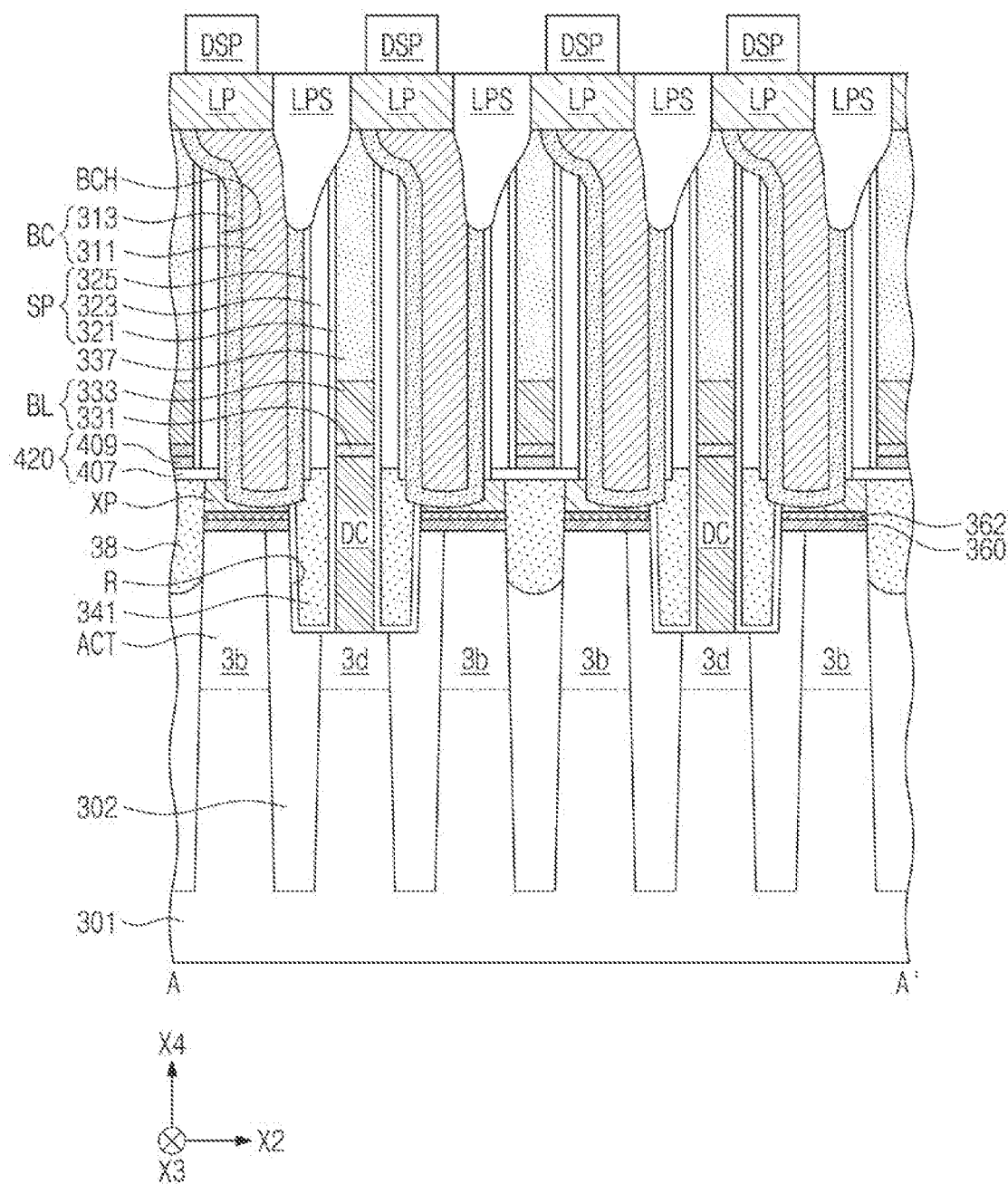
FIG. 8 is a cross-sectional view taken along the line A-A' of FIG. 1 illustrating a semiconductor memory device according to an embodiment of the disclosure.

FIG. 8 is a cross-sectional view taken along the line A-A' of FIG. 1 illustrating a semiconductor memory device according to an embodiment of the disclosure. The semiconductor memory device according to FIG. 8 may have substantially the same features as those described with reference to FIGS. 1, 2A, and 2B, and thus, an overlapping description thereof may be omitted.

Referring to FIG. 8, a fourth ohmic contact layer 362 may be interposed between the second impurity region 3b and the storage node pad XP. A storage node polysilicon pattern 360 may be interposed between the fourth ohmic contact layer 362 and the second impurity region 3b. The fourth ohmic contact layer 362 and the storage node polysilicon pattern 360 may be overlapped with the storage node pad XP in the fourth direction X4. The storage node polysilicon pattern 360 may be formed to cover a portion of the top surface of the device isolation pattern 302. A side surface of the storage node polysilicon pattern 360 and a side surface of the fourth ohmic contact layer 362 may be adjacent to the side surface of the pad separation pattern 38 and the side surface of the spacer liner 321.

In an embodiment, the storage node polysilicon pattern 360 may be formed of or include a doped polysilicon material. The fourth ohmic contact layer 362 may be formed of or include at least one of graphene, TMDC, or BP.

The storage node pad XP may be formed of or include a metallic material, unlike the previous embodiment of FIG. 2A. In an embodiment, the metallic material may be formed at least one of tungsten, titanium, aluminum, copper, ruthenium, iridium, or molybdenum. Since the storage node pad XP includes a metallic material and the fourth ohmic contact layer 362 is interposed between the second impurity region 3b and the storage node pad XP, an electrical resistance of a current path including the impurity region may be decreased. Accordingly, the semiconductor devices and processes for forming the semiconductor devices disclosed herein may improve reliability of the semiconductor device 130.

Figure 9:
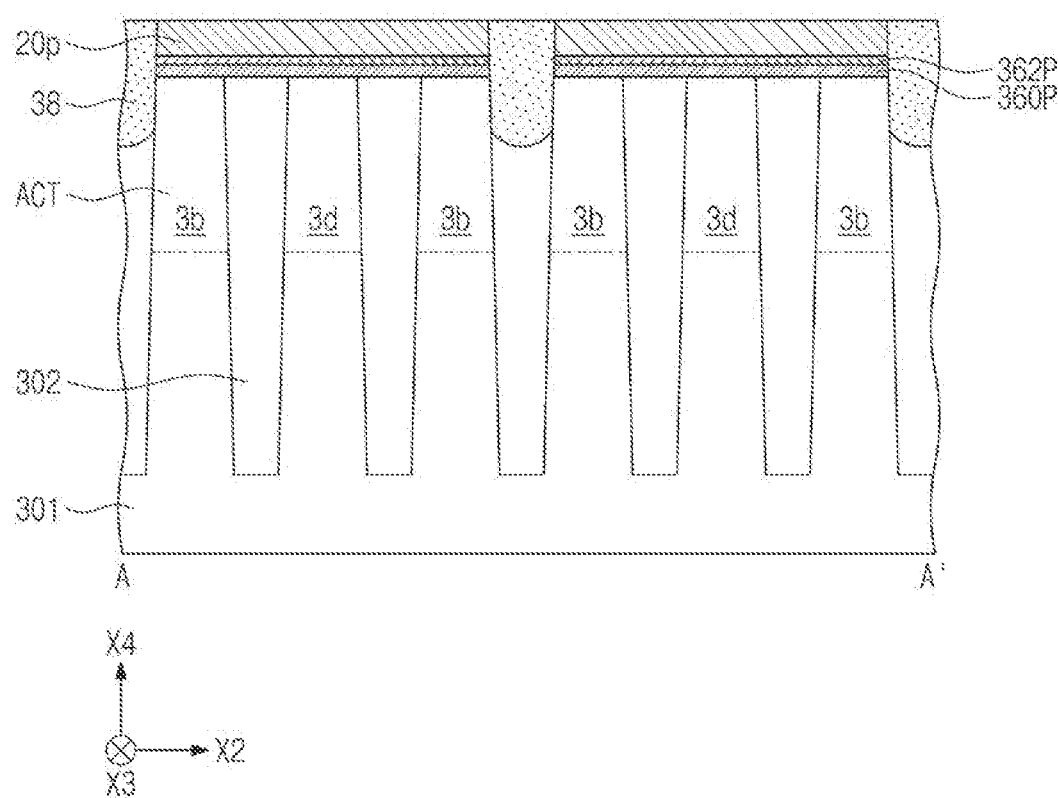
FIG. 9 is a cross-sectional view illustrating a process of fabricating the semiconductor memory device of FIG. 8, according to an example embodiment.

FIG. 9 is a cross-sectional view illustrating a process of fabricating the semiconductor memory device of FIG. 8, according to an example embodiment.

Referring to FIGS. 3A and 9, before forming the conductive layer on the substrate 301, a storage node polysilicon pattern layer and a fourth ohmic contact layer may be sequentially formed. A thickness of the conductive layer may be smaller than a thickness of the conductive layer of FIG. 3A. Thereafter, the conductive layer, the storage node polysilicon pattern layer, and the fourth ohmic contact layer may be etched to form the conductive patterns 20p, a storage node polysilicon pattern 360P, a fourth ohmic contact pattern 362P, and gap regions. A subsequent process may be performed in substantially the same manner as the process described with reference to FIGS. 3B to 3K.

Figure 10:
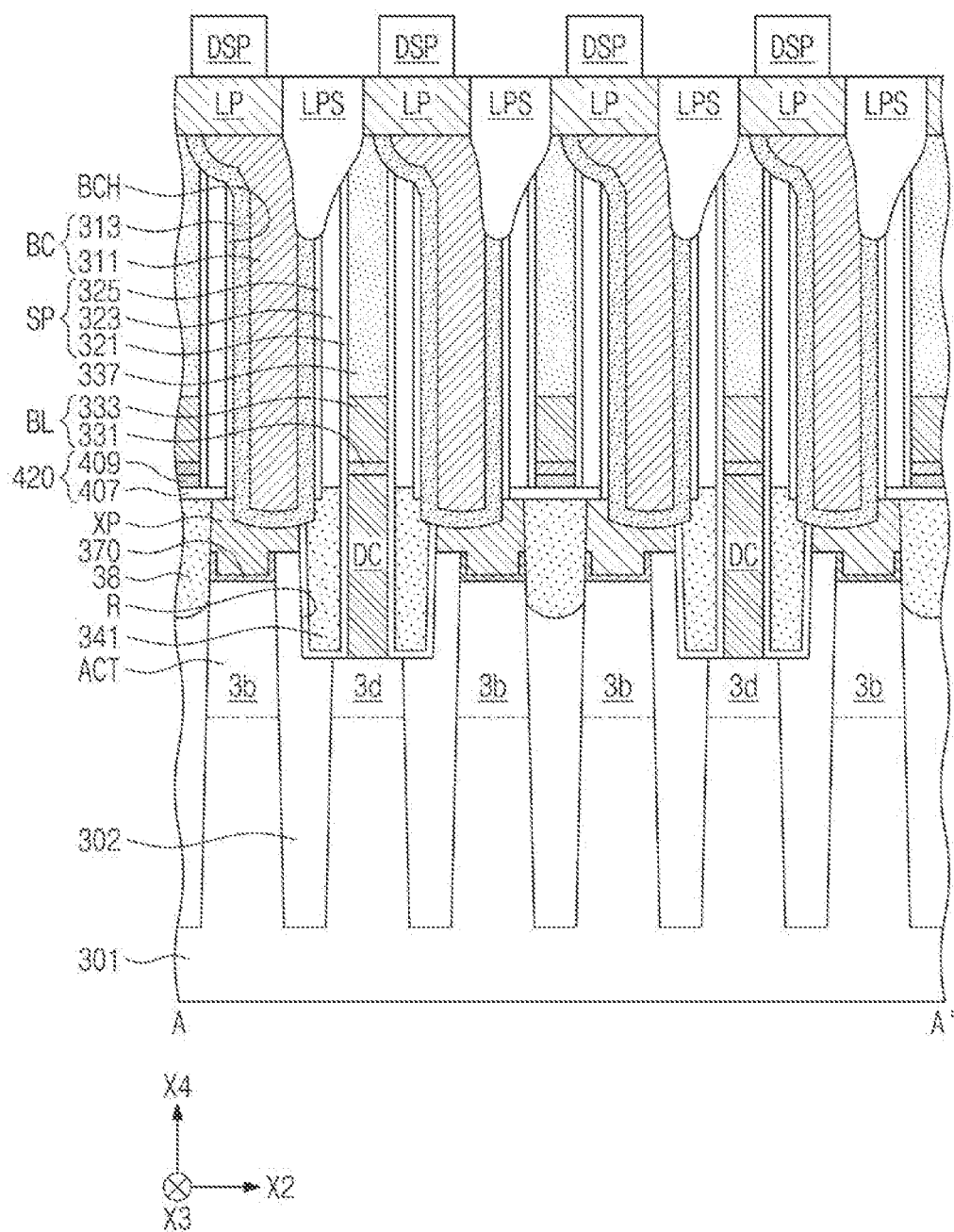
FIG. 10 is a cross-sectional view taken along the line A-A' of FIG. 1 illustrating a semiconductor memory device according to an example embodiment.

FIG. 10 is a cross-sectional view taken along the line A-A' of FIG. 1 illustrating a semiconductor memory device according to an example embodiment. The semiconductor memory device according to FIG. 10 may have substantially the same features as those described with reference to FIGS. 1, 2A, and 2B, and thus, an overlapping description thereof may be omitted.

Referring to FIG. 10, a fifth ohmic contact layer 370 may be interposed between the second impurity region 3b and the storage node pad XP. The fifth ohmic contact layer 370 may be formed to cover a top surface of the second impurity region 3b. The fifth ohmic contact layer 370 may cover the entire bottom surface and at least a portion of the side surface of the storage node pad XP. The storage node pad XP and the second impurity region 3b may be spaced apart from each other with the fifth ohmic contact layer 370 interposed therebetween.

Figure 11:
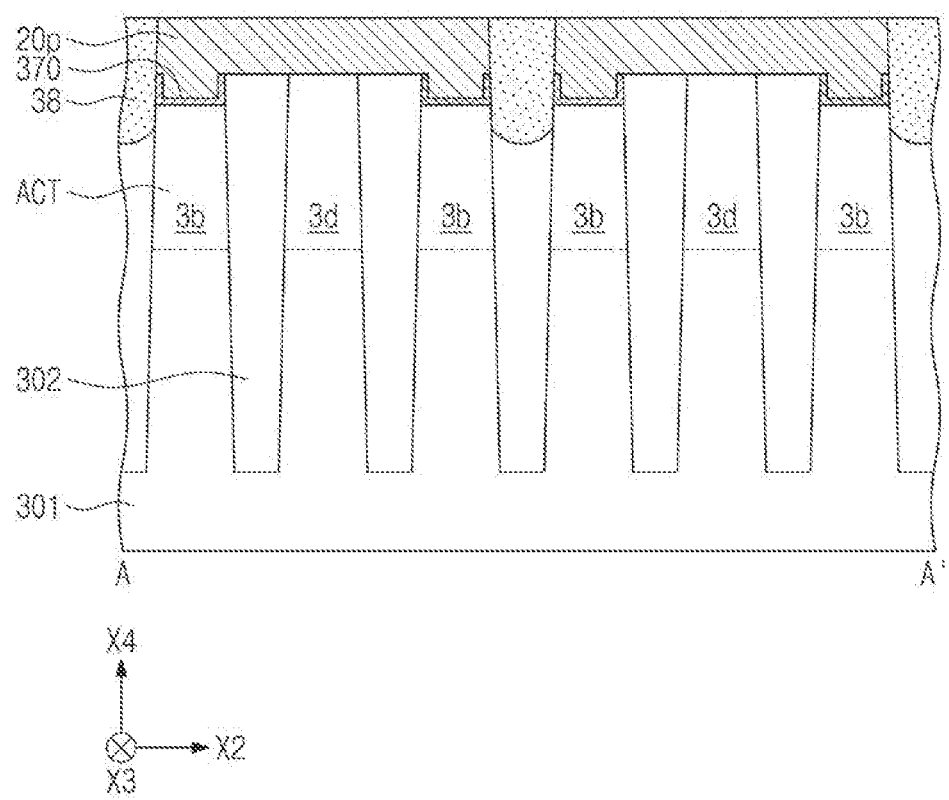
FIG. 11 is a cross-sectional view illustrating a process of fabricating the semiconductor memory device of FIG. 10, according to an example embodiment.

FIG. 11 is a cross-sectional view illustrating a process of fabricating the semiconductor memory device of FIG. 10, according to an example embodiment.

Referring to FIGS. 3A and 11, prior to forming the conductive layer on the substrate 301, the second impurity region 3b may be partially etched. As a result of the etching process, a top surface of the second impurity region 3b may be located at a level that is lower than the top surface of the second impurity region 3b of FIG. 3A. Thereafter, the fifth ohmic contact layer 370 may be formed by depositing a fifth ohmic contact layer and performing an etch-back process thereon. The fifth ohmic contact layer 370 may cover the top surface of the second impurity region 3b and portions of the side surfaces of the device isolation patterns 302. A subsequent process may be performed in substantially the same manner as the process described with reference to FIGS. 3B to 3K.

Figure 12:
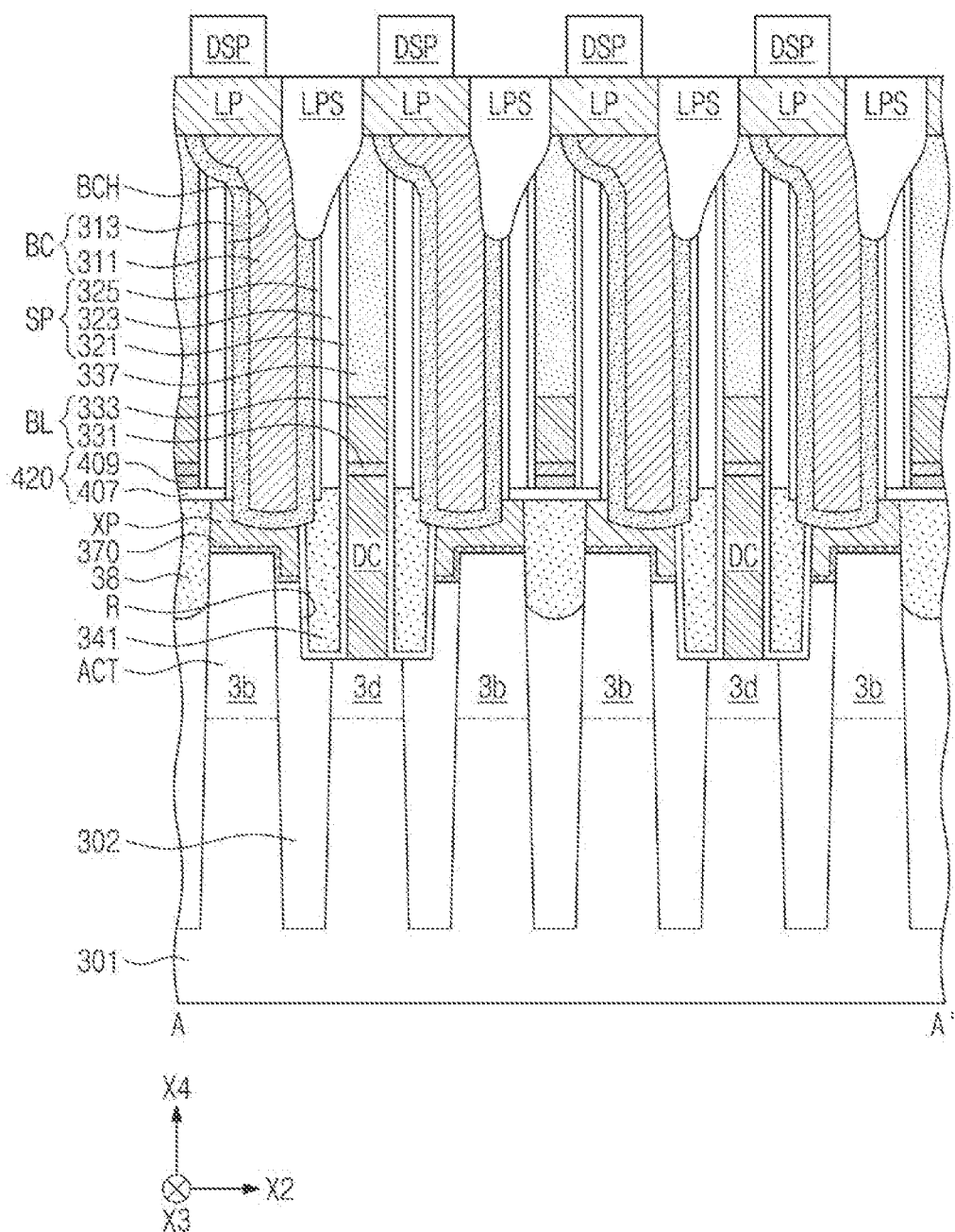
FIG. 12 is a cross-sectional view taken along the line A-A' of FIG. 1 illustrating a semiconductor memory device according to an example embodiment.

FIG. 12 is a cross-sectional view taken along the line A-A' of FIG. 1 illustrating a semiconductor memory device according to an example embodiment. The semiconductor memory device according to FIG. 12 may have substantially the same features as those described with reference to FIGS. 1, 2A, and 2B, and thus, an overlapping description thereof may be omitted.

Referring to FIG. 12, the fifth ohmic contact layer 370 may be interposed between the second impurity region 3b and the storage node pad XP. Top surfaces of the device isolation patterns 302 may be lower than the top surface of the second impurity region 3b. The fifth ohmic contact layer 370 may cover the top surface of the second impurity region 3b, a portion of a side surface of an upper portion of the second impurity region 3b, and a portion of a top surface of the device isolation patterns 302. In an embodiment, the fifth ohmic contact layer 370 may not cover the top surfaces of the device isolation patterns 302, although not shown in the drawings. The storage node pad XP and the second impurity region 3b may be spaced apart from each other with the fifth ohmic contact layer 370 interposed therebetween.

Figure 13:
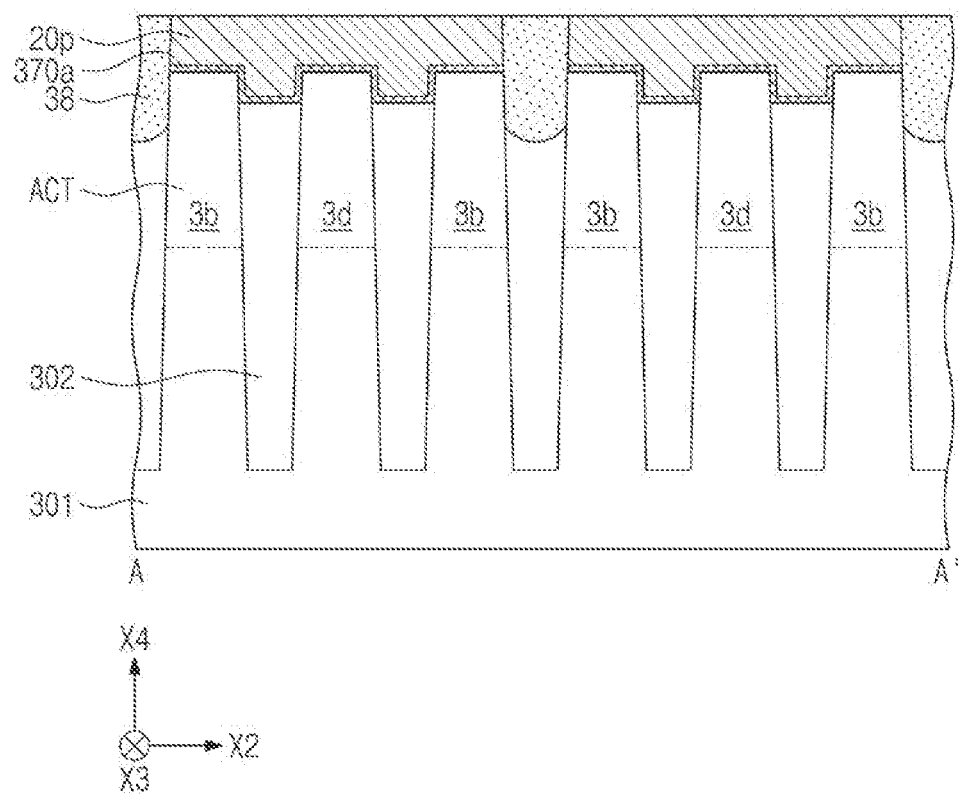
FIG. 13 is a cross-sectional view illustrating a process of fabricating the semiconductor memory device of FIG. 12, according to an example embodiment.

FIG. 13 is a cross-sectional view illustrating a process of fabricating the semiconductor memory device of FIG. 12, according to an example embodiment.

Referring to FIGS. 3A and 13, before forming the conductive layer on the substrate 301, the device isolation patterns 302 may be partially removed. The partial removal of the device isolation patterns 302 may be performed using an etch-back process or a cleaning process. The top surface of the device isolation pattern 302 may be located at a level that is lower than that in the embodiment of FIG. 3A. Thereafter, a fifth ohmic contact layer 370a may be deposited. In a step of forming the contact hole DCH of FIG. 3B, the fifth ohmic contact layer 370a may be etched to form the fifth ohmic contact layer 370. A subsequent process may be performed in substantially the same manner as the process described with reference to FIGS. 3B to 3K.

Figure 14:
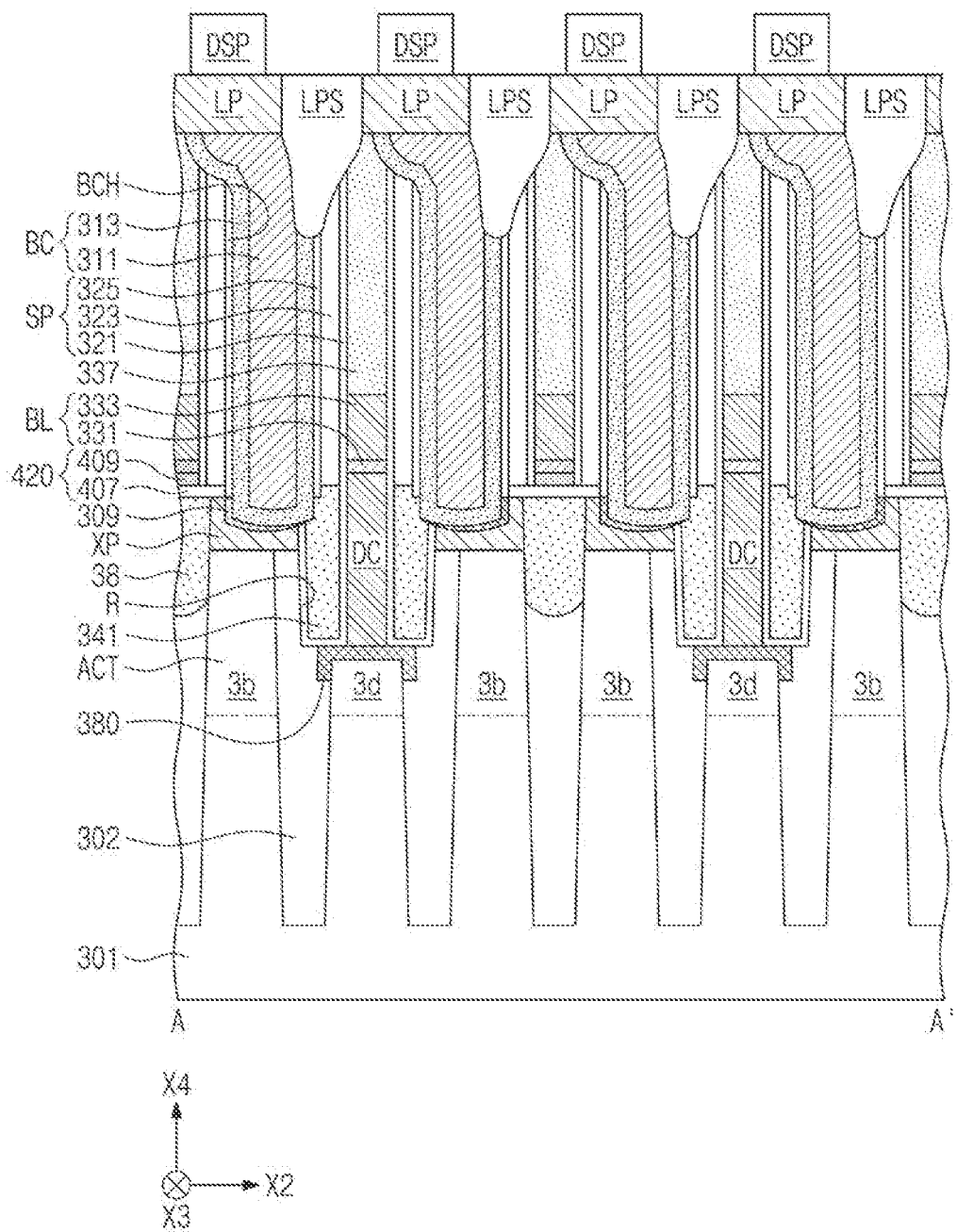
FIG. 14 is a cross-sectional view taken along the line A-A' of FIG. 1 illustrating a semiconductor memory device according to an example embodiment.

FIG. 14 is a cross-sectional view taken along the line A-A' of FIG. 1 illustrating a semiconductor memory device according to an example embodiment. The semiconductor memory device according to FIG. 14 may have substantially the same features as those described with reference to FIGS. 1, 2A, and 2B, and thus, an overlapping description thereof may be omitted.

Referring to FIG. 14, a sixth ohmic contact layer 380 may be interposed between the first impurity region 3d and the bit line contacts DC. The sixth ohmic contact layer 380 of FIG. 14 may have an upward convex shape, unlike the second ohmic contact layer 350 of FIG. 4A. The sixth ohmic contact layer 380 may cover a top surface of the first impurity region 3d and a portion of a side surface of an upper portion of the first impurity region 3d. The bit line contacts DC and the first impurity region 3d may be spaced apart from each other with the sixth ohmic contact layer 380 interposed therebetween.

Figure 15:
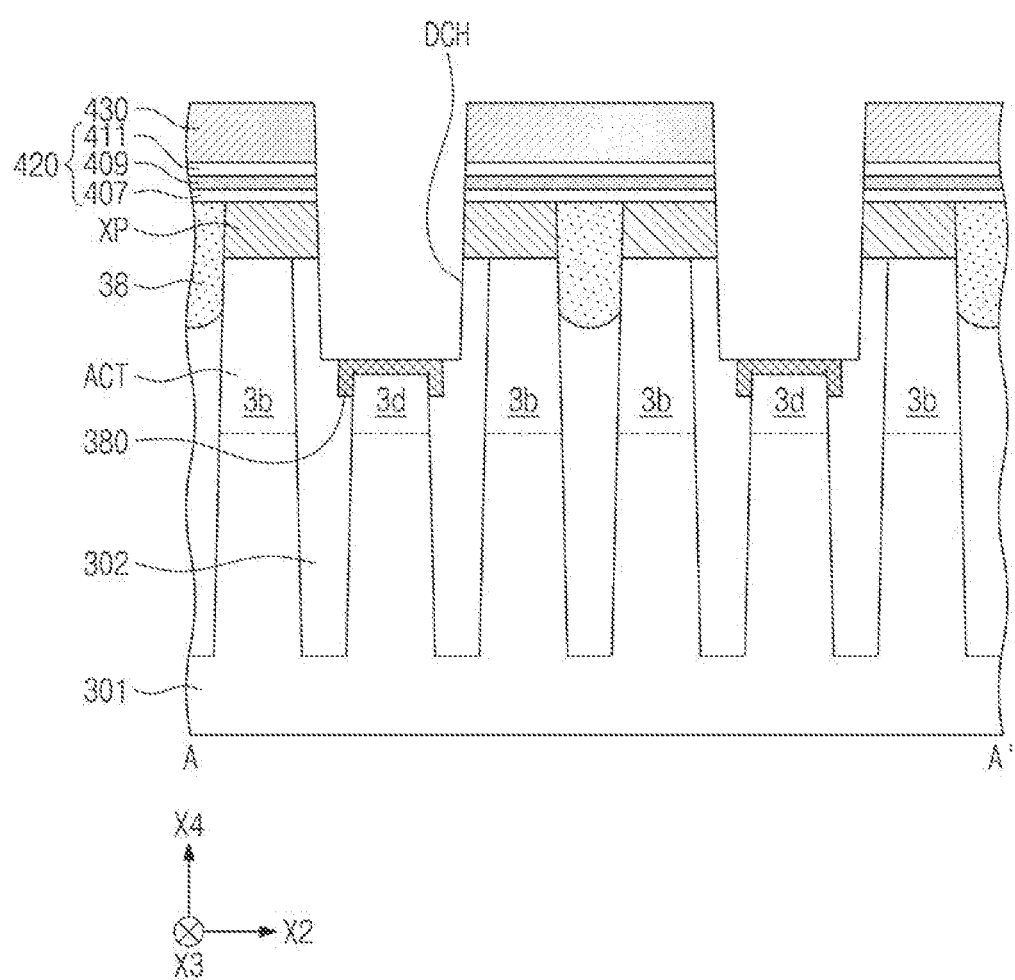
FIG. 15 is a cross-sectional view illustrating a process of fabricating the semiconductor memory device of FIG. 14, according to an example embodiment.

FIG. 15 is a cross-sectional view illustrating a process of fabricating the semiconductor memory device of FIG. 14, according to an example embodiment.

Referring to FIGS. 3B and 15, after the formation of the contact hole DCH, the device isolation patterns 302 adjacent to the first impurity region 3d may be partially etched. The etching process may be performed using a dry etching process. After the etching process, the sixth ohmic contact layer 380 may be formed by depositing a sixth ohmic contact layer and performing an etch-back process thereon. A subsequent process may be performed in substantially the same manner as the process described with reference to FIGS. 3C to 3K.

Figure 16A:
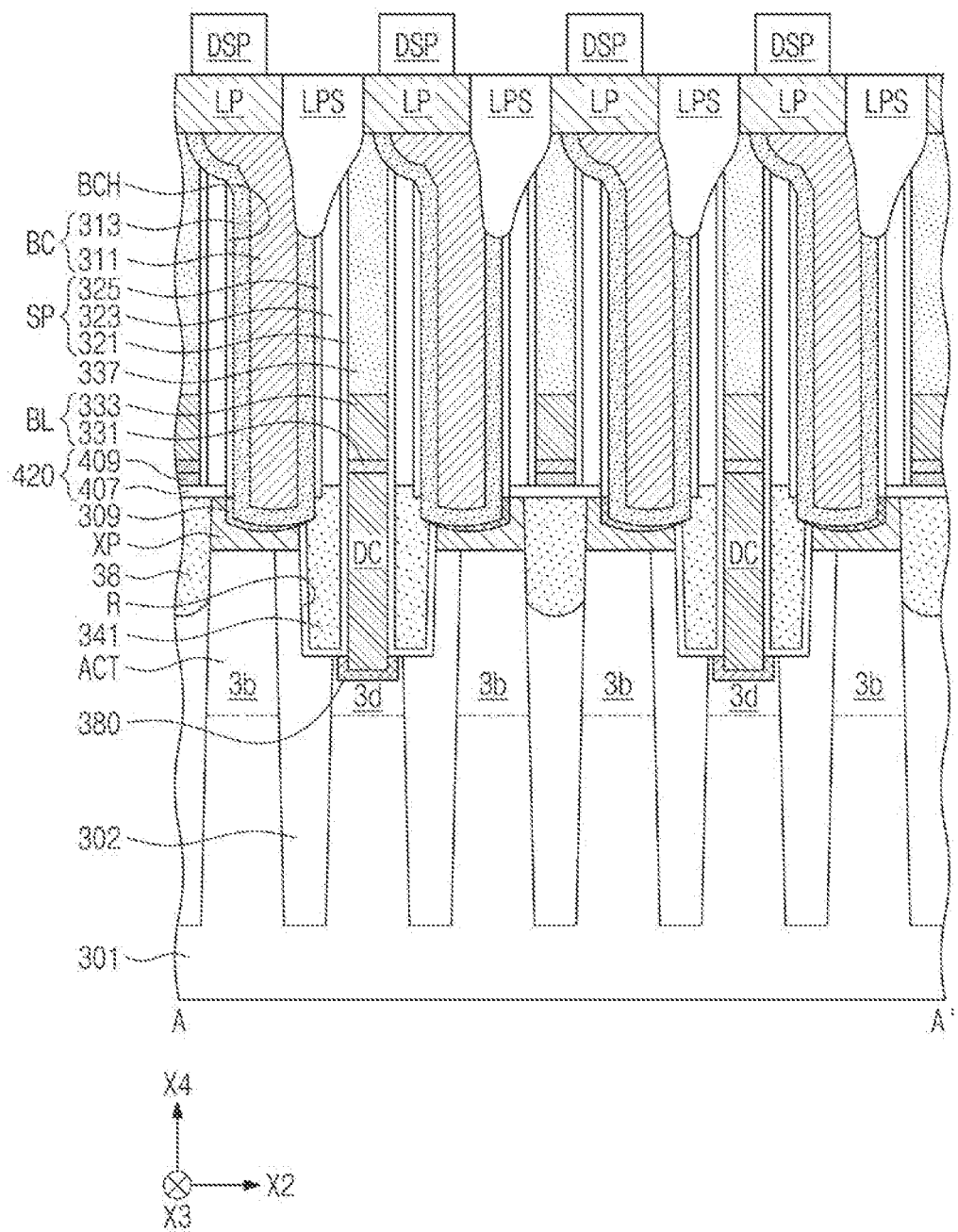
FIGS. 16A and 16B are cross-sectional views, which are taken along the lines A-A' and B-B', respectively, of FIG. 1 illustrating a semiconductor memory device according to an example embodiment.
Figure 16B:
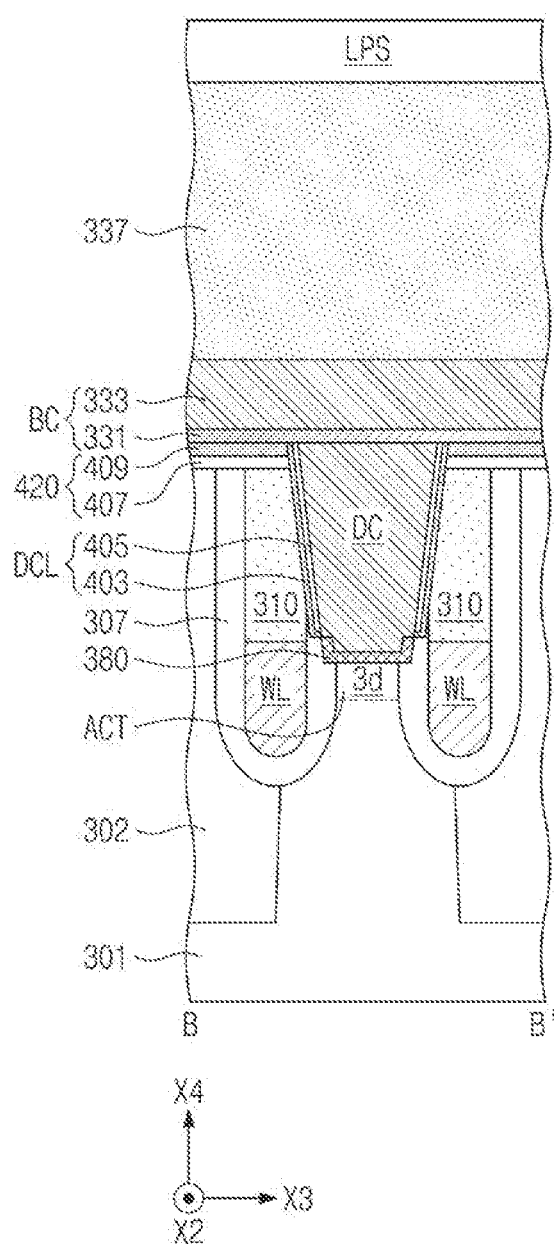

FIGS. 16A and 16B are cross-sectional views, which are taken along the lines A-A' and B-B', respectively, of FIG. 1 illustrating a semiconductor memory device according to an example embodiment. The semiconductor memory device according to FIGS. 16A and 16B may have substantially the same features as those described with reference to FIGS. 1, 2A, and 2B, and thus, an overlapping description thereof may be omitted.

Referring to FIGS. 16A and 16B, the sixth ohmic contact layer 380 may be interposed between the bit line contacts DC and the first impurity region 3d. The sixth ohmic contact layer 380 of FIGS. 16A and 16B may have a downward convex shape, unlike the sixth ohmic contact layer 380 of FIG. 14. The sixth ohmic contact layer 380 may cover a bottom surface of the bit line contacts DC and a portion of a side surface of a lower portion of the bit line contacts DC. The bit line contacts DC and the first impurity region 3d may be spaced apart from each other with the sixth ohmic contact layer 380 interposed therebetween.

Figure 17:
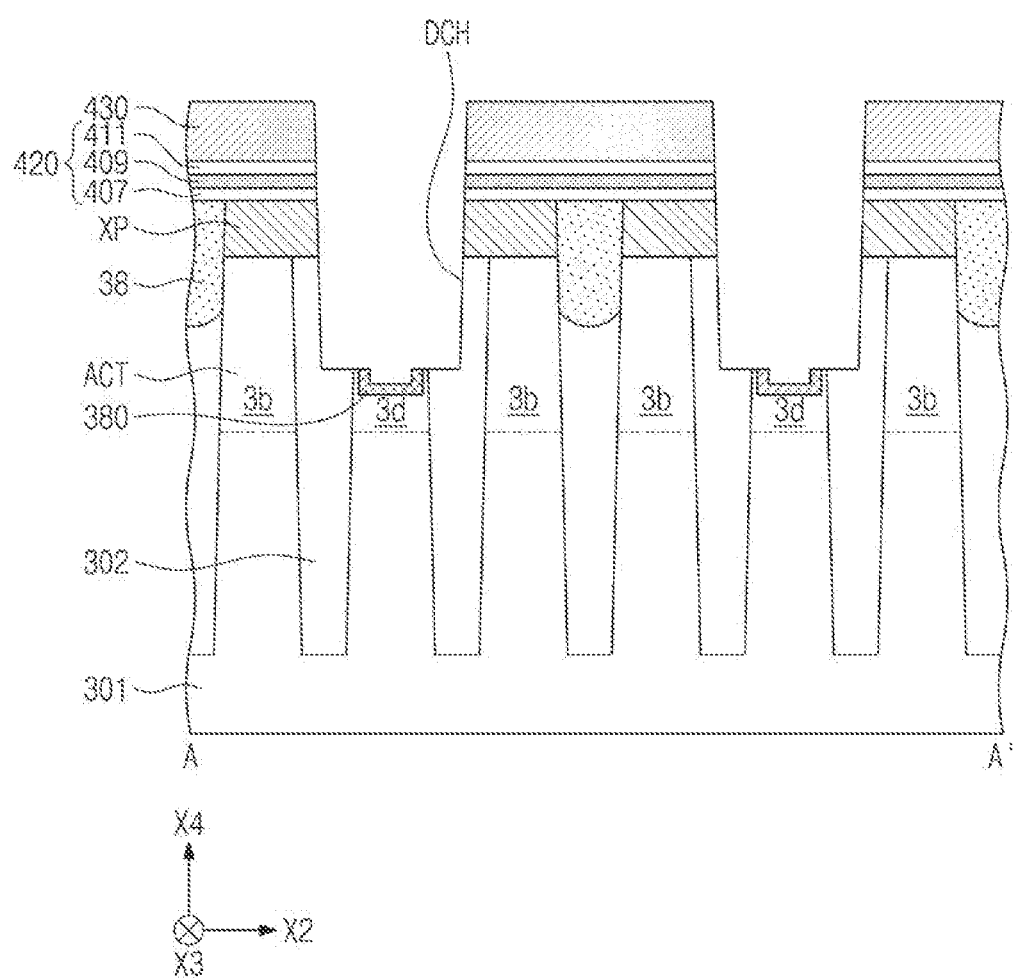
FIG. 17 is a cross-sectional view illustrating a process of fabricating the semiconductor memory device of FIG. 16A, according to an example embodiment.

FIG. 17 is a cross-sectional view illustrating a process of fabricating the semiconductor memory device of FIG. 16A, according to an example embodiment.

Referring to FIGS. 3B and 17, after the formation of the contact hole DCH, a portion of the first impurity region 3d may be etched. Thereafter, the sixth ohmic contact layer 380 may be formed by depositing a sixth ohmic contact layer and performing an etch-back process thereon. A subsequent process may be performed in substantially the same manner as the process described with reference to FIGS. 3C to 3K.

According to an embodiment of the disclosure, a semiconductor device may include an active portion defined by a device isolation pattern, and the active portion may include a first impurity region and a second impurity region. An ohmic contact layer may be disposed in at least one of regions between the first impurity region and a bit line and between the second impurity region and a storage node contact. The ohmic contact layer may include a two-dimensional material (e.g., graphene). In this case, the ohmic contact layer may have a low Schottky barrier and a low electrical resistance. In the case where the ohmic contact layer is interposed between the storage node contact and a storage node pad on the second impurity region, it may be unnecessary to form the storage node pad at a high impurity concentration, due to the low electrical resistance of the ohmic contact layer. Accordingly, the semiconductor devices and processes for forming the semiconductor devices disclosed herein may prevent impurities in the storage node pad from being diffused into the second impurity region and thereby improve reliability of the semiconductor device.

In an embodiment, each of a bit line contact and a storage node pad may be formed of or include a metallic material. In the case where the ohmic contact layers are respectively interposed between the first impurity region and the bit line contact and between the second impurity region and the storage node pad, the semiconductor devices and processes for forming the semiconductor devices disclosed herein may reduce an electrical resistance of the semiconductor device.

While example embodiments of the disclosure have been particularly shown and described, it will be understood by one of ordinary skill in the art that variations in form and detail may be made therein without departing from the spirit and scope of the attached claims.

What is claimed is:

1. A semiconductor memory device, comprising:
an active portion defined by a device isolation pattern, the active portion comprising a first impurity region located at a center portion of the active portion and a second impurity region located at an end portion of the active portion;
a word line provided on the active portion and extending in a first direction;
a bit line provided on the word line and extending in a second direction crossing the first direction;
a bit line contact provided between the bit line and the first impurity region of the active portion;
a storage node pad provided on the second impurity region of the active portion;
a storage node contact provided on the storage node pad and at a side of the bit line; and
an ohmic contact layer provided in at least one of a first region between the first impurity region and the bit line and a second region between the second impurity region and the storage node contact,
wherein the ohmic contact layer comprises a two-dimensional material.

2. The semiconductor memory device of claim 1, wherein the ohmic contact layer comprises at least one of graphene, transition metal dichalcogenides (TMDC), and black phosphorus (BP).

3. The semiconductor memory device of claim 1, wherein the bit line contact comprises a metallic material, and
wherein the ohmic contact layer is provided between the first impurity region and the bit line contact.

4. The semiconductor memory device of claim 1, wherein the bit line contact comprises polysilicon,
wherein the semiconductor memory device further comprises a bit line metal pattern interposed between the bit line contact and the bit line, and
wherein the ohmic contact layer is provided between the bit line contact and the bit line metal pattern.

5. The semiconductor memory device of claim 4, wherein the bit line metal pattern comprises at least one of tungsten, titanium, aluminum, copper, ruthenium, iridium, and molybdenum.

6. The semiconductor memory device of claim 1, wherein the storage node pad comprises polysilicon.

7. The semiconductor memory device of claim 6, wherein the ohmic contact layer is provided between the storage node pad and the storage node contact.

8. The semiconductor memory device of claim 7, wherein the ohmic contact layer comprises a rounded bottom surface.

9. The semiconductor memory device of claim 1, wherein the storage node pad comprises a metallic material.

10. The semiconductor memory device of claim 9, wherein the ohmic contact layer is provided between the storage node pad and the second impurity region.

11. The semiconductor memory device of claim 10, further comprising a storage node polysilicon pattern provided between the ohmic contact layer and the second impurity region.

12. The semiconductor memory device of claim 10, wherein the ohmic contact layer is provided to enclose an entire bottom surface of the storage node pad and at least a portion of a side surface of the storage node pad.

13. A semiconductor memory device, comprising:
an active portion defined by a device isolation pattern, the active portion comprising a first impurity region and a second impurity region;
a word line provided on the active portion and extending in a first direction;
a bit line provided on the word line and extending in a second direction crossing the first direction;

a bit line contact provided between the bit line and the first impurity region of the active portion;

a storage node pad provided on the second impurity region of the active portion; and a storage node contact provided on the storage node pad and at a side of the bit line, wherein the bit line contact and the storage node pad comprise a metallic material, wherein the bit line contact is vertically spaced apart from the first impurity region of the active portion, and wherein the storage node pad is vertically spaced apart from the second impurity region of the active portion.

14. The semiconductor memory device of claim 13, further comprising:

a first ohmic contact layer provided between the first impurity region of the active portion and the bit line contact; and a second ohmic contact layer provided between the second impurity region of the active portion and the storage node pad, wherein the first ohmic contact layer and the second ohmic contact layer comprise at least one of graphene, transition metal dichalcogenides, and black phosphorus.

15. The semiconductor memory device of claim 14, wherein the metallic material comprises at least one of tungsten, titanium, ruthenium, and molybdenum.

16. The semiconductor memory device of claim 14, further comprising a storage node polysilicon pattern provided between the second impurity region and the second ohmic contact layer.

17. The semiconductor memory device of claim 14, wherein the second ohmic contact layer is provided to enclose a entire bottom surface of the storage node pad and at least a portion of a side surface of the storage node pad.

18. A semiconductor memory device, comprising:

a device isolation pattern defining active portions comprising a first impurity region and a second impurity region;

a word line extending in a first direction to cross the active portions;

a bit line vertically overlapping with the first impurity region, the bit line provided on the word line, and extending in a second direction crossing the first direction;

a bit line contact provided between the bit line and the first impurity region;

a bit line capping pattern on the bit line contact;

a storage node pad on the second impurity region;

a first ohmic contact layer on the storage node pad;

a storage node contact provided at a side of the bit line and adjacent to the first ohmic contact layer;

a landing pad on the storage node contact;

a gapfill insulating pattern provided between the storage node pad and the bit line contact; and a bit line spacer provided between the bit line and the storage node contact, wherein the first ohmic contact layer comprises at least one of graphene, transition metal dichalcogenides, and black phosphorus.

19. The semiconductor memory device of claim 18, wherein the bit line contact comprises at least one of tungsten, titanium, ruthenium, and molybdenum.

20. The semiconductor memory device of claim 19, further comprising a second ohmic contact layer provided between the first impurity region and the bit line contact, wherein the second ohmic contact layer comprises at least one of graphene, transition metal dichalcogenides, and black phosphorus.

* * * * *